United States Patent
Murai et al.

(10) Patent No.: US 7,910,980 B2
(45) Date of Patent: Mar. 22, 2011

(54) SONOS DEVICE WITH INSULATING STORAGE LAYER AND P-N JUNCTION ISOLATION

(75) Inventors: Hiroshi Murai, Fukushima-ken (JP); Masahiko Higashi, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 294 days.

(21) Appl. No.: 12/235,321

(22) Filed: Sep. 22, 2008

(65) Prior Publication Data

US 2009/0237990 A1 Sep. 24, 2009

(30) Foreign Application Priority Data

Sep. 20, 2007 (JP) ................................. 2007-243952

(51) Int. Cl.
*H01L 29/792* (2006.01)

(52) U.S. Cl. ................................ 257/324; 257/E29.309
(58) Field of Classification Search ........................ None
See application file for complete search history.

(56) References Cited

U.S. PATENT DOCUMENTS

| | | | | |
|---|---|---|---|---|
| 7,307,879 | B2 * | 12/2007 | Yokoi et al. | 365/185.03 |
| 2006/0278936 | A1 * | 12/2006 | Fujii et al. | 257/382 |
| 2007/0210373 | A1 * | 9/2007 | Utsuno et al. | 257/324 |
| 2008/0191321 | A1 * | 8/2008 | Fujii et al. | 257/637 |
| 2008/0224275 | A1 * | 9/2008 | Hayakawa et al. | 257/637 |

* cited by examiner

*Primary Examiner* — Benjamin P Sandvik

(57) ABSTRACT

The present invention provides a semiconductor device and a method for manufacturing thereof. The semiconductor device includes bit lines disposed in a semiconductor substrate, a first ONO disposed between the bit lines on the semiconductor substrate, and a second ONO film disposed on each of the bit lines. The film thickness of a first silicon nitride film in the first ONO film is larger than the film thickness of a second silicon nitride film in the second ONO film.

15 Claims, 26 Drawing Sheets

FIG. 5A
FIG. 5C
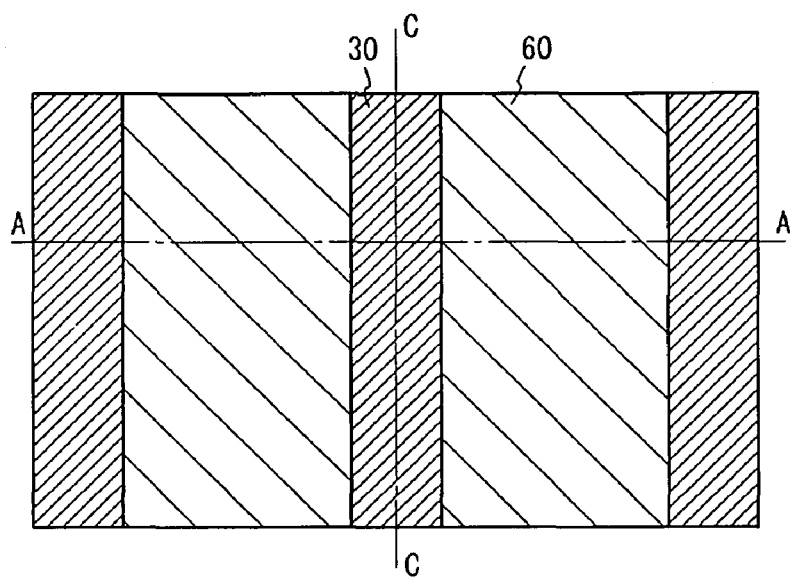
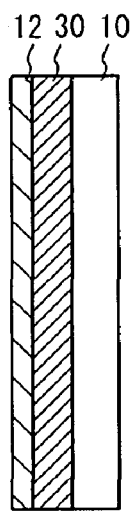
FIG. 5B
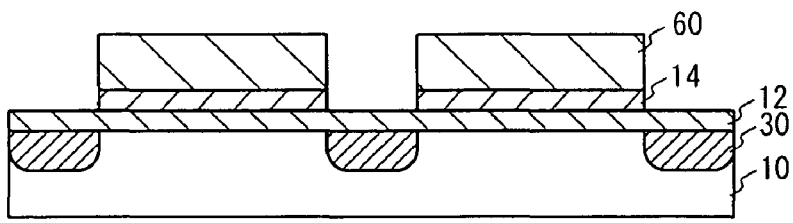

(d)

FIG. 10A
FIG. 10D
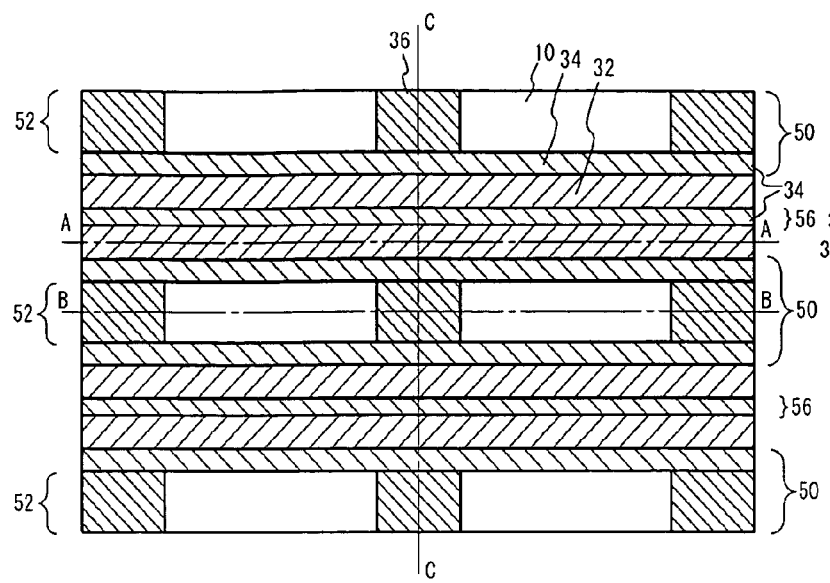
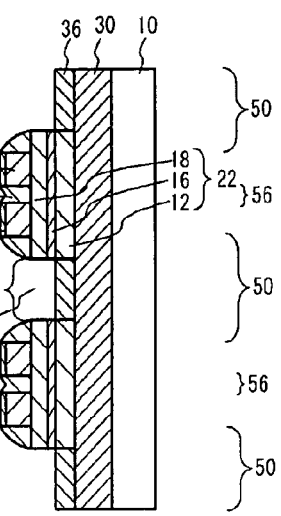
FIG. 10B
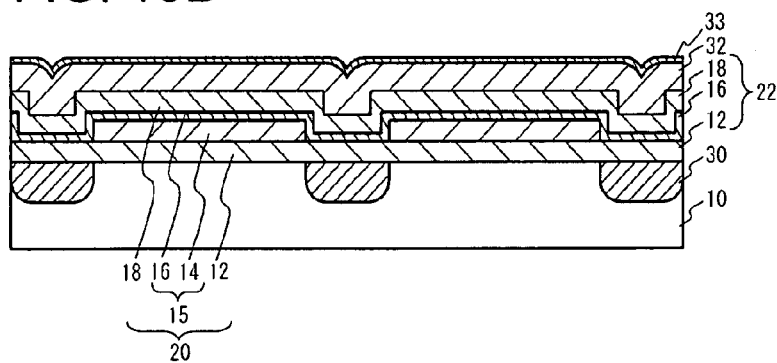
FIG. 10C
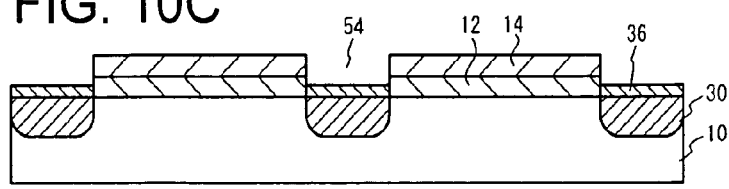

FIG. 11A
FIG. 11D
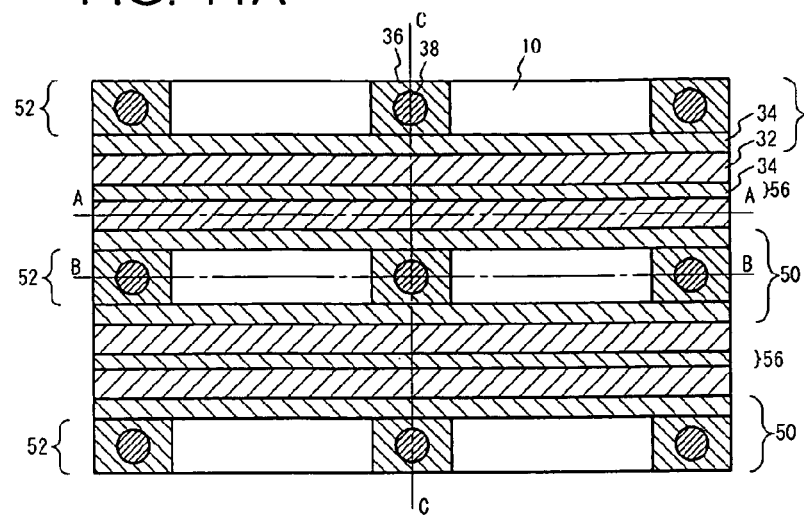
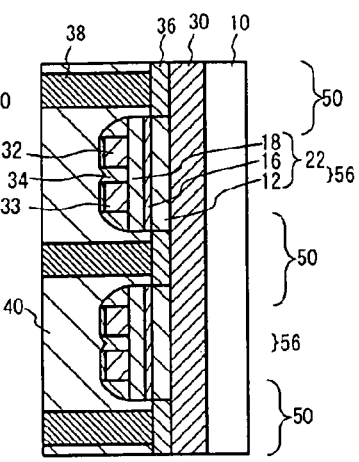
FIG. 11B
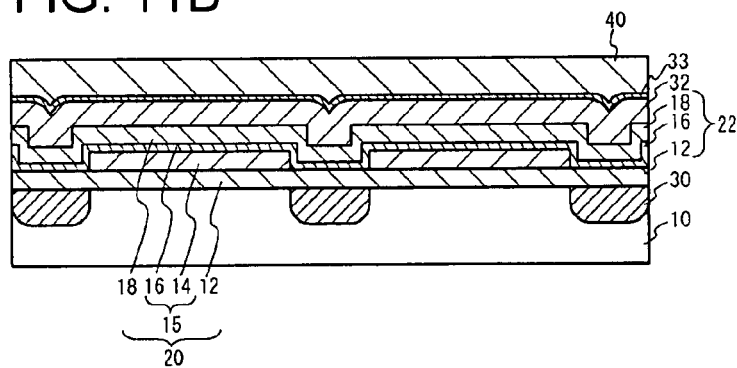
FIG. 11C
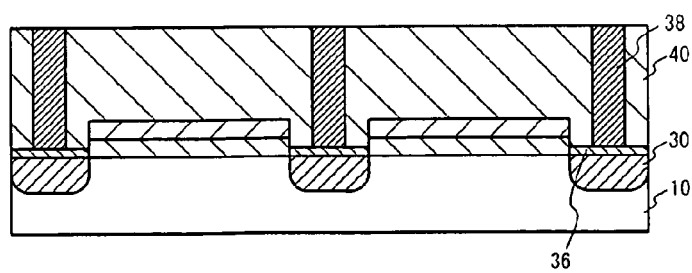

FIG. 15A
FIG. 15C
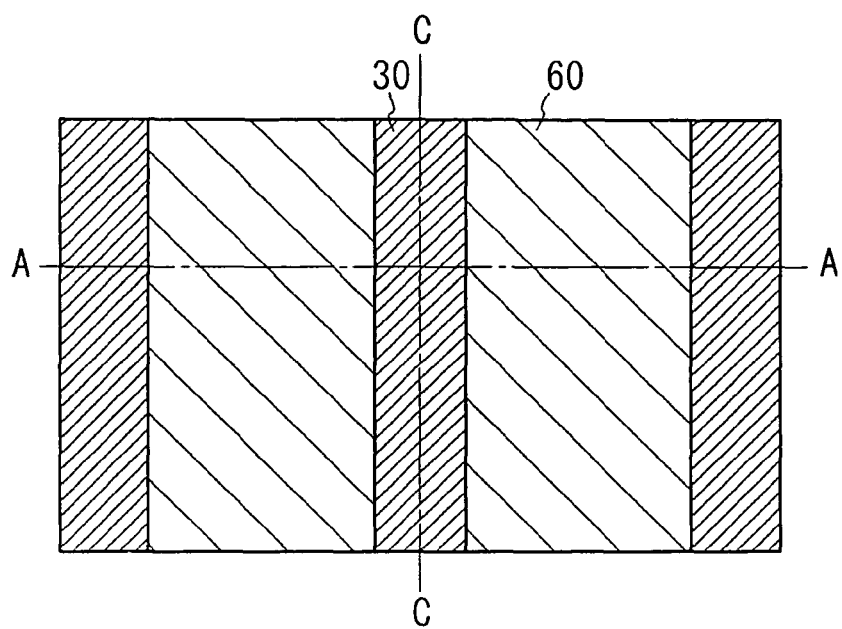
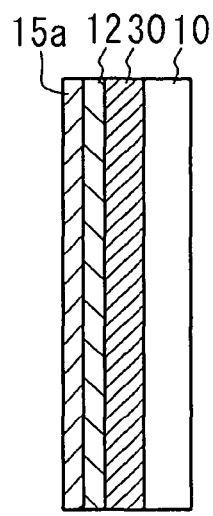
FIG. 15B
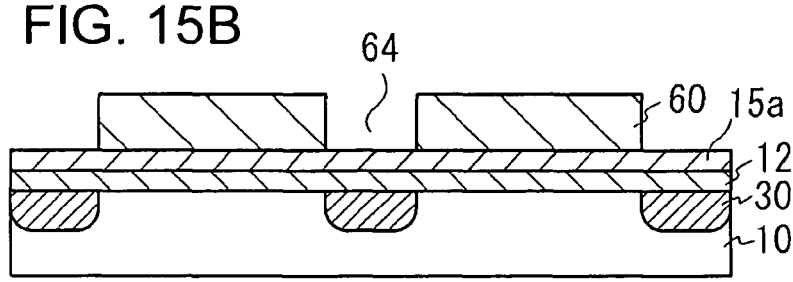

FIG. 19A
FIG. 19D
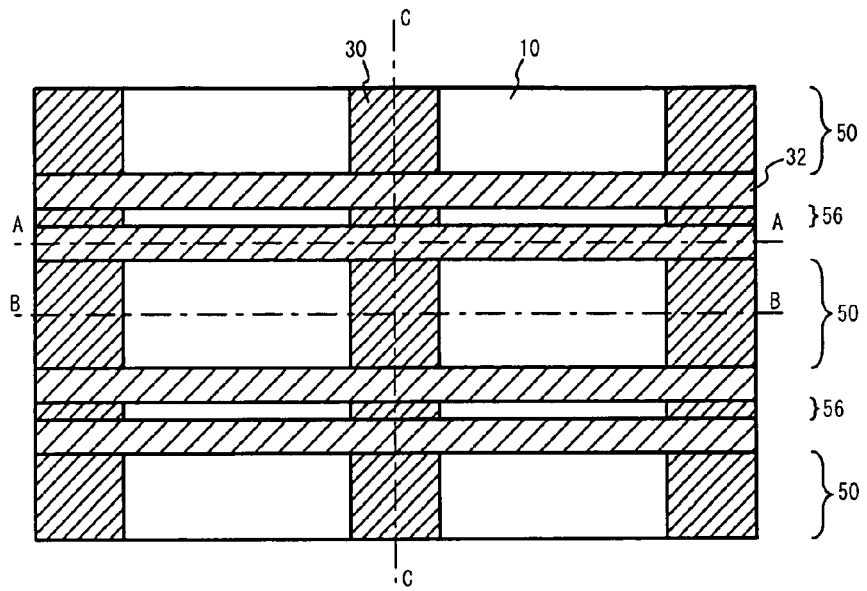
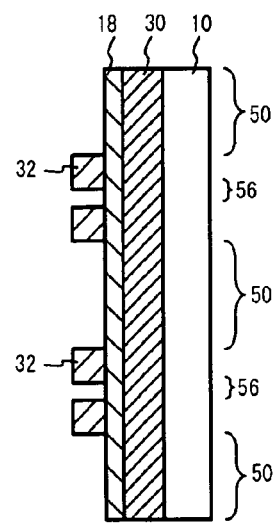
FIG. 19B
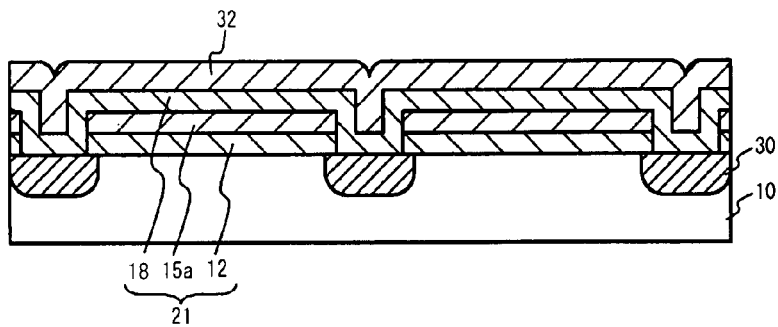
FIG. 19C
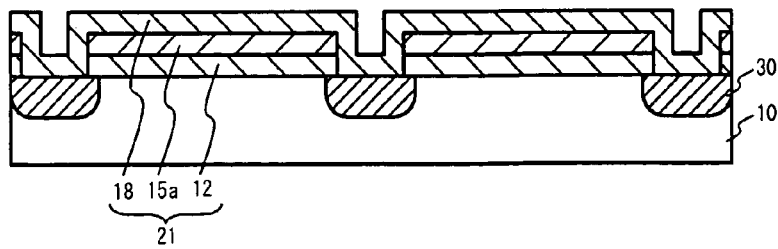

FIG. 20A
FIG. 20D
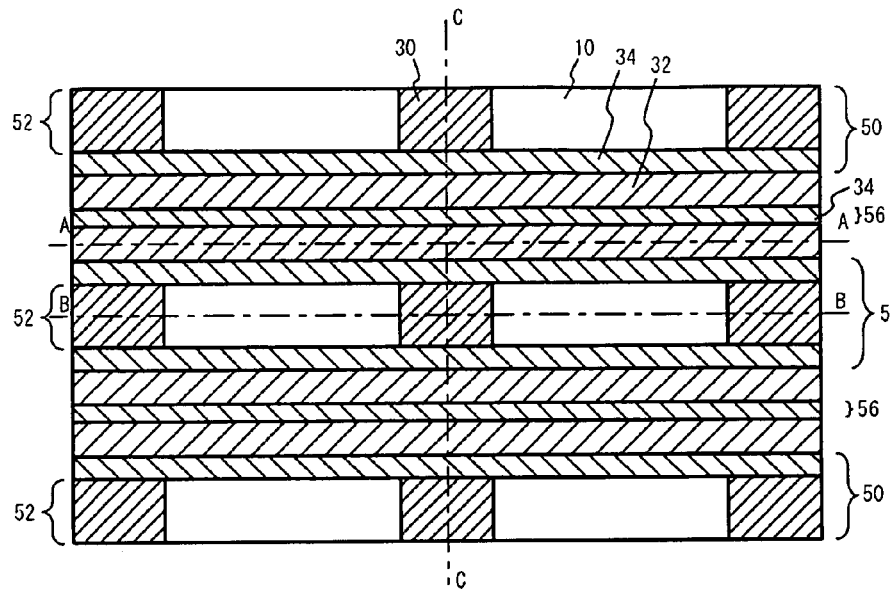
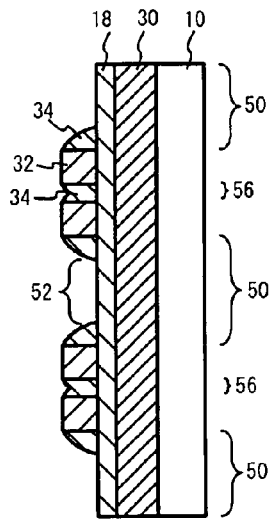
FIG. 20B
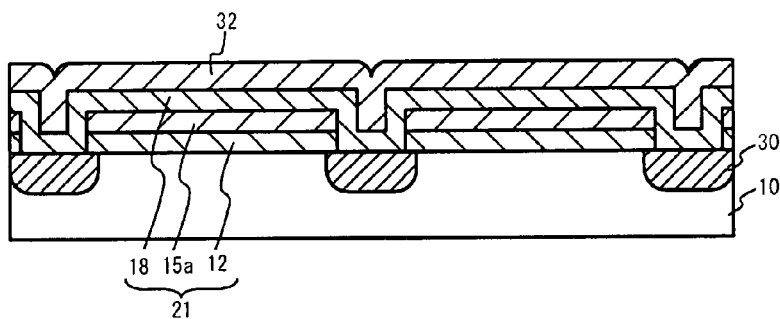
FIG. 20C
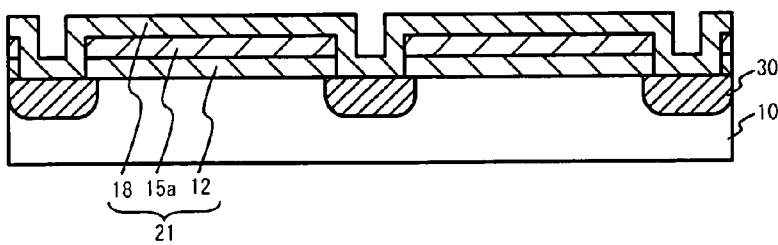

SONOS DEVICE WITH INSULATING STORAGE LAYER AND P-N JUNCTION ISOLATION

CLAIM OF PRIORITY

This application claims priority from Japanese patent application 2007-243952 filed on Sep. 20, 2007.

TECHNICAL FIELD

The present invention relates to a semiconductor device and a method for manufacturing the same and, more particularly, to a semiconductor device having a non-volatile memory disposed with a bit line and an ONO film and a method for manufacturing the same.

BACKGROUND

Recently, the usage of non-volatile memory comprising a semiconductor device capable of rewriting data and retaining data stored therein even while the device is un-powered has become increasingly popular. Flash memory is one example of non-volatile memory. A typical flash memory is disposed with a transistor which operates as a memory cell and includes a floating gate or an insulating film called a charge storage layer for accumulating electrons used to store data. Flash memory with a SONOS (Silicon Oxide Nitride Oxide Silicon) structure for accumulating the electrons in a trap layer of an ONO (Oxide Nitride Oxide) film has been introduced as a flash memory using an insulating film as the charge storage layer.

U.S. Pat. No. 6,011,725 discloses a SONOS structured flash memory having a virtual ground memory cell which is symmetrically operated by switching between a source and a drain. In this flash memory, a bit line which serves as a source and a drain is formed in a semiconductor substrate and electric charges can be stored in a trap layer in an ONO film formed on the semiconductor substrate. By switching between the source and the drain, two charge storage regions can be formed in a single memory cell.

Japanese Patent Application Publication No. JP-A-2005-57187 discloses a technology to form a metal silicide layer on a bit line by forming a spacer in an ONO film.

FIG. 1A is an illustration of a conventional flash memory and is a cross-sectional view taken along a word line, i.e. a gate. According to FIG. 1A, bit lines 30 are formed in a semiconductor substrate 10. A first silicon oxide film 12 that is a tunnel oxide film, a trap layer 14a, and a second silicon oxide film 18 that is a top oxide film are disposed on the semiconductor substrate 10 as an ONO film 20a. A word line 32 is disposed on the ONO film 20a. On both sides of each of the bit lines 30 in the trap layer 14a, electric charges 58 are stored. However, since the trap layer 14a is also formed on the bit line 30, electric charges are diffused onto the bit line 30 along the direction as indicated in FIG. 1A. Therefore, electric charges on a channel, i.e. between the bit lines 30 of the semiconductor substrate 10, are reduced. The threshold voltage of a transistor which configures a memory cell is determined by the electric charges on the channel. Consequently, even when electric charges are stored in the trap layer 14a, the electric charges which do not contribute to the threshold voltage of the transistor will increase.

FIG. 1B is an alternate illustration of a conventional flash memory and is a cross-sectional view in the neighborhood of a plug metal coupled to the bit line. With reference to FIG. 1B, the bit line 30 is formed in the semiconductor substrate 10, the ONO film 20a is disposed on the semiconductor substrate 10, and an interlayer insulation film 40 is disposed on the ONO film 20a. A plug metal 38 coupled to the bit line 30 is disposed in the interlayer insulation film 40. A wiring layer 42 is coupled to the plug metal 38, and a protective film 44 is disposed on the interlayer insulation film 40. The plug metal 38 is directly coupled to the bit line 30 that is an n-type semiconductor. Therefore, a contact resistance between the plug metal 38 and the bit line 30 becomes high.

If a metal silicide layer is disposed between the bit line 30 and the plug metal 38, the contact resistance between the plug metal 38 and the bit line 30 can be reduced. However, when the metal silicide layer is also formed on the semiconductor substrate 10, the semiconductor substrate 10 that is a p-type semiconductor and the bit line 30 that is an n-type semiconductor are electrically coupled. Therefore, the metal silicide layer is required to be disposed only on the bit line 30. For this purpose, an opening in the ONO film 20a is required to be disposed by using an exposure technology. Unfortunately, disposing an opening only in the ONO film 20a on the fine bit line 30 can be difficult.

SUMMARY OF THE INVENTION

This Summary is disposed to introduce a selection of concepts in a simplified form that are further described below in the Detailed Description. This Summary is not intended to identify key features or essential features of the claimed subject matter, nor is it intended to be used to limit the scope of the claimed subject matter.

The claimed subject matter is directed to provide a semiconductor device which prevents stored electric charges in an ONO film from diffusing onto a bit line or reduces a contact resistance between the bit line and a plug metal, and a method for manufacturing the same.

One embodiment of the claimed subject matter provides a semiconductor device comprising: bit lines disposed in a semiconductor substrate; a first ONO film disposed between the bit lines on the semiconductor substrate; and a second ONO film disposed on each of the bit lines. A film thickness of a first silicon nitride film in the first ONO film is larger than a film thickness of a second silicon nitride film in the second ONO film. According to the present invention, electric charges stored in the thick first silicon nitride film near the bit lines can be prevented from diffusing in the thin second silicon nitride film on each of the bit lines.

Another embodiment of the claimed subject matter provides a semiconductor device comprising: bit lines disposed in a semiconductor substrate; an ONO film disposed on the semiconductor substrate, a first ONO film being disposed between the bit lines on the semiconductor substrate, and a second ONO film being disposed on each of the bit lines; a metal silicide layer disposed in an opening in the ONO film on each of the bit lines; and a coupling metal layer directly coupled to the metal silicide layer. According to the present invention, since the coupling metal layer is in contact with the metal silicide layer, the contact resistance between the coupling metal layer and the bit lines can be reduced.

A further embodiment of the claimed subject matter provides a semiconductor device including: bit lines disposed in a semiconductor substrate; an ONO film disposed on the semiconductor substrate, the ONO film being disposed between the bit lines on the semiconductor substrate, and a top oxide film in the ONO film being directly disposed on each of the bit lines; a metal silicide layer disposed in an opening in the ONO film on each of the bit lines, the opening being offset from an edge of each of the bit lines; and a coupling metal layer directly coupled to the metal silicide layer. According to the present invention, since the coupling metal layer contacts with the metal silicide layer, the contact resistance between the coupling metal layer and the bit lines can be reduced. Further, since the silicide metal is offset from the edge of each of the bit lines, the metal silicide layer can be prevented from contacting the semiconductor substrate.

One embodiment of the claimed subject matter provides a method for manufacturing a semiconductor device comprising: forming a lower silicon nitride film on a semiconductor substrate; removing the lower silicon nitride film by using a mask layer formed on the lower silicon nitride film as a mask; forming bit lines in the semiconductor substrate by using the mask layer as a mask; and forming an upper silicon nitride film on the lower silicon nitride film and the bit lines. According to the present invention, the process to reduce the thickness of the silicon nitride film on each of the bit lines and the process to form the bit lines can be carried out in a self-aligned manner. Consequently, manufacturing process can be optimized.

Another embodiment of the claimed subject matter provides a method for manufacturing a semiconductor device comprising: forming a first silicon nitride film on a semiconductor substrate between areas to be bit lines; forming a second silicon nitride film having a film thickness smaller than that of the first silicon nitride film on the semiconductor substrate in each of the areas to be the bit lines; forming the bit lines in the semiconductor substrate; forming word lines on the second silicon nitride film, the word lines crossing the bit lines; etching, between the word lines, the first silicon nitride film and the second silicon nitride film so that the first silicon nitride film remains between the bit lines and so that the second silicon nitride film on each of the bit lines is removed; forming a metal silicide layer on each of the bit lines between the word lines; and forming a coupling metal layer that couples to the metal silicide layer. According to the present invention, since the first silicon nitride film remains on the surface between the bit lines between the word lines, the silicide metal is not formed on the first silicon nitride film, and the silicide metal layer can be selectively formed on each of the bit lines between the word lines.

Yet another embodiment of the claimed subject matter provides a method for manufacturing a semiconductor device comprising: forming a third silicon nitride film on a semiconductor substrate; forming bit lines in the semiconductor substrate by using a mask layer formed on the third silicon nitride film as a mask; forming a spacer on a side of the mask layer; removing the third silicon nitride film by using the mask layer and the spacer as a mask; and forming a metal silicide layer on each of the bit lines by using the third silicon nitride film as a mask. According to the present invention, since the edges of the bit lines and the silicide metal layer are offset, the silicide metal layer can be prevented from being formed on the semiconductor substrate.

According to the present invention, the semiconductor device which prevents electric charges stored in the ONO film from diffusing onto the bit lines or reduces the contact resistance between the bit lines and the plug metal, and the method for manufacturing the same is provided.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5A is a top view illustration of a fourth step in a method for manufacturing a flash memory according to one embodiment of the present invention;

FIG. 5B is a cross-sectional view taken along the line A-A of a fourth step in a method for manufacturing a flash memory according to one embodiment of the present invention;

FIG. 5C is a cross-sectional view taken along the line B-B of a fourth step in a method for manufacturing a flash memory according to one embodiment of the present invention;

FIG. 10A is a top view illustration of a ninth step in a method for manufacturing a flash memory according to one embodiment of the present invention;

FIG. 10B is a cross-sectional view taken along the line A-A of a ninth step in a method for manufacturing a flash memory according to one embodiment of the present invention;

FIG. 10C is a cross-sectional view taken along the line B-B of a ninth step in a method for manufacturing a flash memory according to one embodiment of the present invention;

FIG. 10D is a cross-sectional view taken along the line C-C of a ninth step in a method for manufacturing a flash memory according to one embodiment of the present invention;

FIG. 11A is a top view illustration of a tenth step in a method for manufacturing a flash memory according to one embodiment of the present invention;

FIG. 11B is a cross-sectional view taken along the line A-A of a tenth step in a method for manufacturing a flash memory according to one embodiment of the present invention;

FIG. 11C is a cross-sectional view taken along the line B-B of a tenth step in a method for manufacturing a flash memory according to one embodiment of the present invention;

FIG. 11D is a cross-sectional view taken along the line C-C of a tenth step in a method for manufacturing a flash memory according to one embodiment of the present invention;

FIG. 15A is a top view illustration of a second step in a method for manufacturing a flash memory according to another embodiment of the present invention;

FIG. 15B is a cross-sectional view taken along the line A-A of a second step in a method for manufacturing a flash memory according to another embodiment of the present invention;

FIG. 15C is a cross-sectional view taken along the line C-C of a second step in a method for manufacturing a flash memory according to another embodiment of the present invention;

FIG. 19A is a top view illustration of a sixth step in a method for manufacturing a flash memory according to another embodiment of the present invention;

FIG. 19B is a cross-sectional view taken along the line A-A of a sixth step in a method for manufacturing a flash memory according to another embodiment of the present invention;

FIG. 19C is a cross-sectional view taken along the line B-B of a sixth step in a method for manufacturing a flash memory according to another embodiment of the present invention;

FIG. 19D is a cross-sectional view taken along the line C-C of a sixth step in a method for manufacturing a flash memory according to another embodiment of the present invention;

FIG. 20A is a top view illustration of a seventh step in a method for manufacturing a flash memory according to another embodiment of the present invention;

FIG. 20B is a cross-sectional view taken along the line A-A of a seventh step in a method for manufacturing a flash memory according to another embodiment of the present invention;

FIG. 20C is a cross-sectional view taken along the line B-B of a seventh step in a method for manufacturing a flash memory according to another embodiment of the present invention;

FIG. 20D is a cross-sectional view taken along the line C-C of a seventh step in a method for manufacturing a flash memory according to another embodiment of the present invention;

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1A:
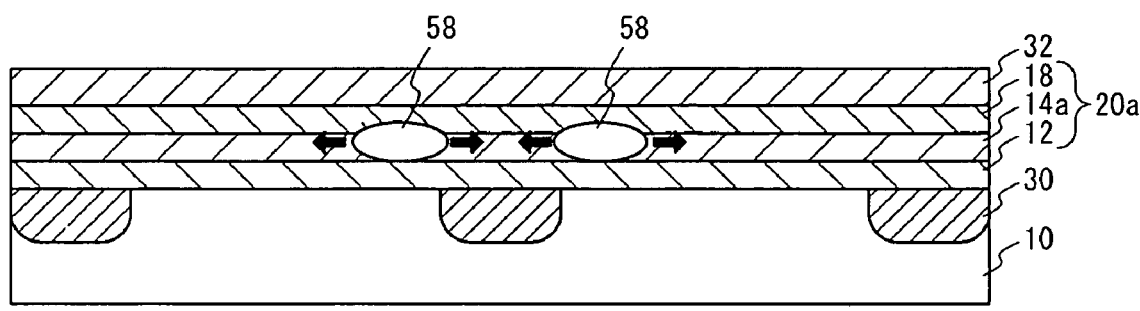
FIG. 1A is an illustration of a conventional flash memory.
Figure 1B:
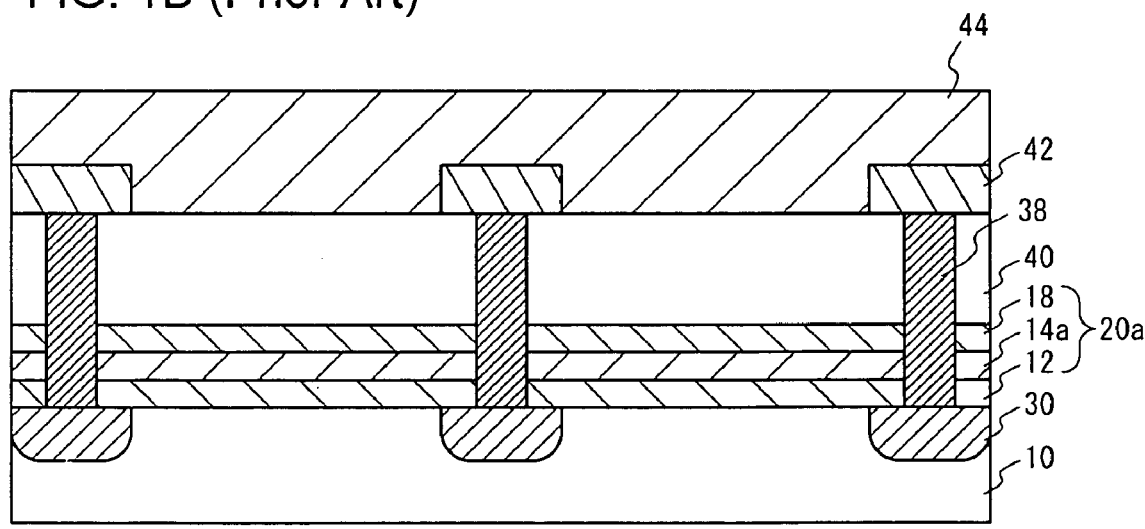
FIG. 1B is an alternate illustration of a conventional flash memory.
Figure 2A:
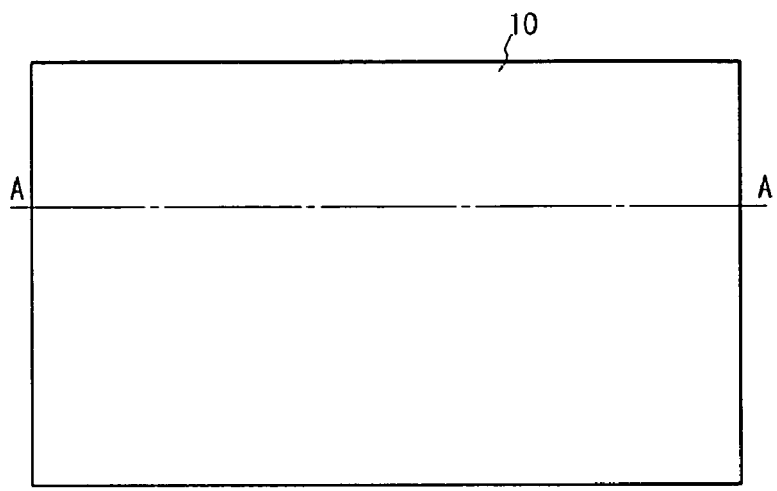
FIG. 2A is a top view illustration of a first step in a method for manufacturing a flash memory according to one embodiment of the present invention.
Figure 2B:
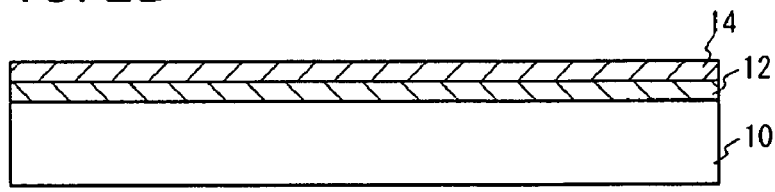
FIG. 2B is a cross-sectional view taken along the line A-A of a first step in a method for manufacturing a flash memory according to one embodiment of the present invention.

FIGS. 2A to 12D are top views and cross-sectional views to illustrate a method for manufacturing a flash memory according to one embodiment of the present invention. With reference to FIGS. 2A and 2B, a first silicon oxide film 12 of a film thickness of about 7 nm is formed on a p-type silicon semiconductor substrate 10 (or a p-type domain in a silicon semiconductor substrate) as a tunnel oxide film by a thermal oxidation method. A lower silicon nitride film 14 of a film thickness of about 5 nm is formed on the first silicon oxide film 12, by a chemical vapor deposition (CVD) method.

Figure 3A:
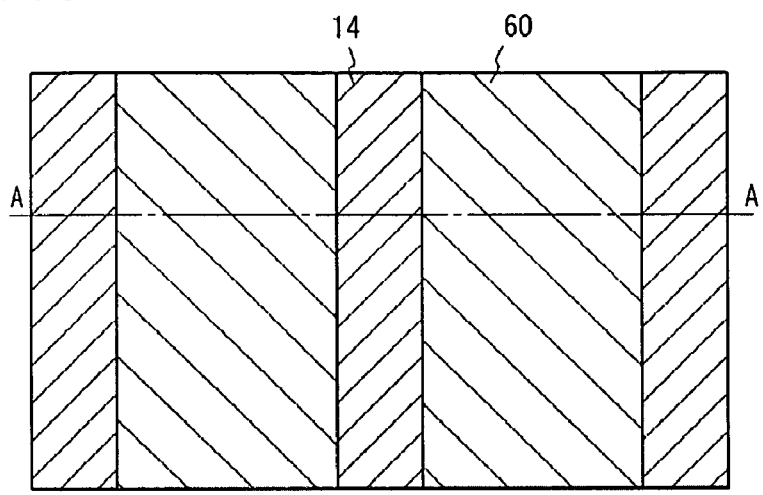
FIG. 3A is a top view illustration of a second step in a method for manufacturing a flash memory according to one embodiment of the present invention.
Figure 3B:
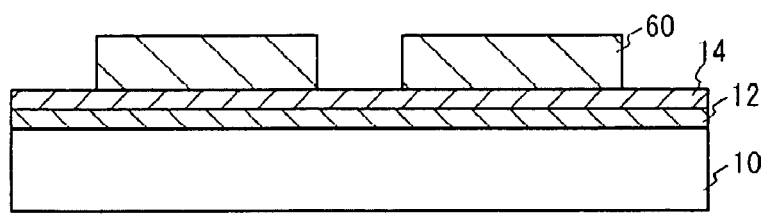
FIG. 3B is a cross-sectional view taken along the line A-A of a second step in a method for manufacturing a flash memory according to one embodiment of the present invention.
Figure 4A:
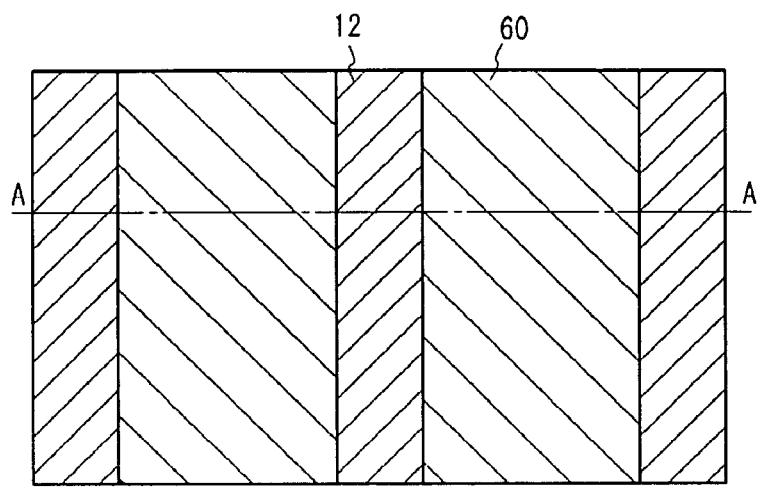
FIG. 4A is a top view illustration of a third step in a method for manufacturing a flash memory according to one embodiment of the present invention.
Figure 4B:
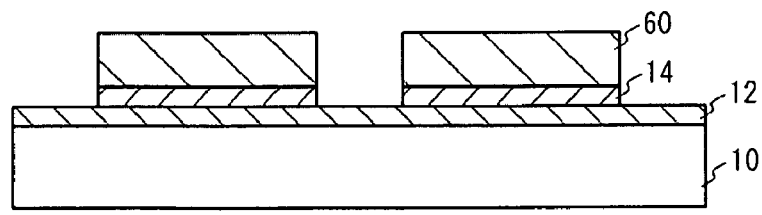
FIG. 4B is a cross-sectional view taken along the line A-A of a third step in a method for manufacturing a flash memory according to one embodiment of the present invention.

With reference to FIGS. 3A and 3B, a photoresist 60 is coated on the lower silicon nitride film 14, and, by using exposure and developing technologies, an opening is formed in the area where a bit line is to be formed. With reference to FIGS. 4A and 4B, the lower silicon nitride film 14 is dry etched with the photoresist 60 as a mask. In this case, by selectively etching the silicon nitride film against the silicon oxide film, the first silicon oxide film 12 is made to remain under the opening in the lower silicon nitride film 14. With reference to FIGS. 5A to 5C, arsenic is implanted with the photoresist 60 as a mask and thereafter, by heat treatment, a bit line 30 of an n-type domain is formed in the semiconductor substrate 10.

Figure 6A:
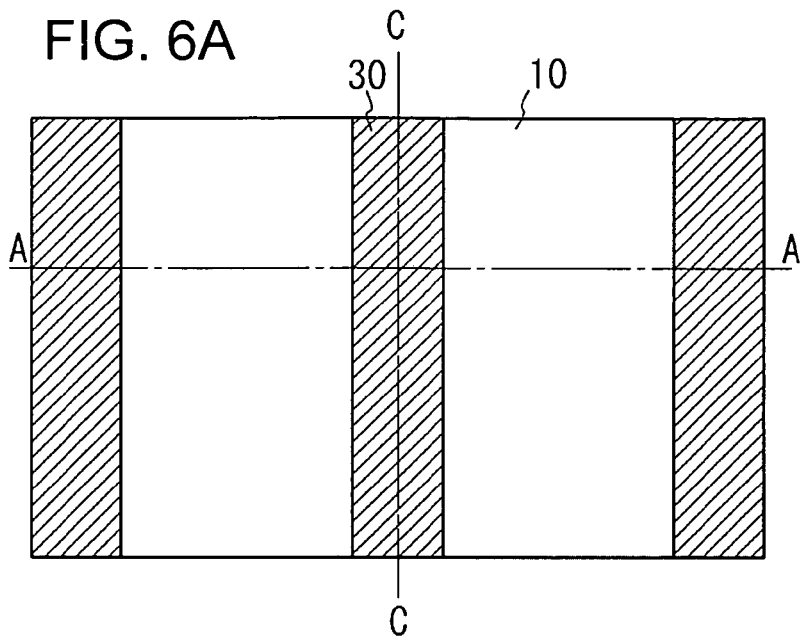
FIG. 6A is a top view illustration of a fifth step in a method for manufacturing a flash memory according to one embodiment of the present invention.
Figure 6C:
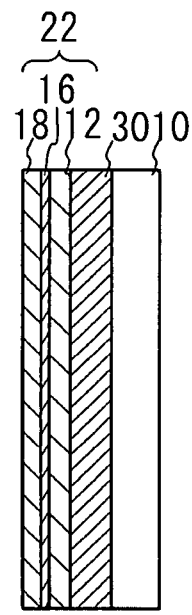
FIG. 6C is a cross-sectional view taken along the line C-C of a fifth step in a method for manufacturing a flash memory according to one embodiment of the present invention.
Figure 6B:
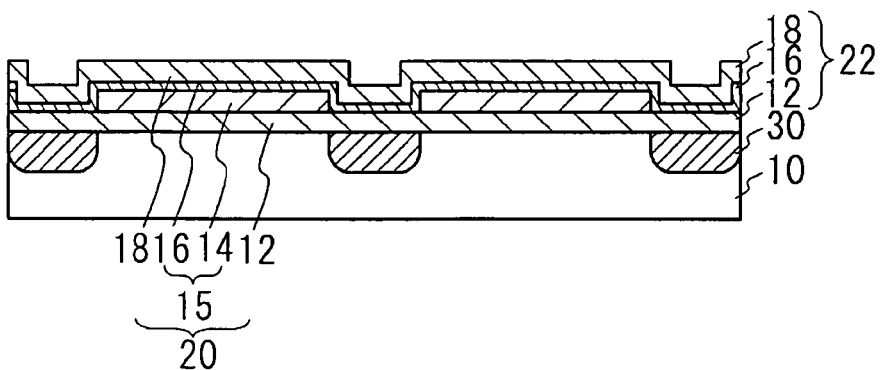
FIG. 6B is a cross-sectional view taken along the line A-A of a fifth step in a method for manufacturing a flash memory according to one embodiment of the present invention.

With reference to FIGS. 6A to 6C, an upper silicon nitride film 16 of a film thickness of about 7 nm is formed on the lower silicon nitride film 14 and on the first silicon oxide film 12 by using a CVD method. In this case, the upper silicon nitride film 16 is formed at a higher growth temperature than that of the lower silicon nitride film 14. Consequently, the density of a trap layer which traps electric charges in the upper silicon nitride film 16 is reduced from that of the lower silicon nitride film 14. On the upper silicon nitride film 16, a second silicon oxide film 18 of a film thickness of about 10 nm is formed as a top oxide film by using the CVD method. In this case, the surface of the upper silicon nitride film 16 is oxidized and the film thickness of the upper silicon nitride film 16 is reduced by approximately 4 nm.

As described above, with reference to FIG. 6B, a first ONO film 20 composed of the first silicon oxide film 12, a first silicon nitride film 15 composed of the lower silicon nitride film 14 and the upper silicon nitride film 16, and the second silicon oxide film 18 is formed on the semiconductor substrate 10 between the bit lines 30. In this case, the film thickness of the lower silicon nitride film 14 is approximately 5 nm, the film thickness of the upper silicon nitride film 16 is approximately 3 nm, and the film thickness of the first silicon nitride film 15 is approximately 8 nm. Meanwhile, a second ONO film 22 composed of the first silicon oxide film 12, the second silicon nitride film 16 composed of the upper silicon nitride film 16, and the second silicon oxide film 18 is formed on (an area to be) the bit line 30. In this case, the film thickness of the upper silicon nitride film 16 is approximately 3 nm and, more specifically, the film thickness of the second silicon nitride film is approximately 3 nm. As described above, the ONO films disposed on the semiconductor substrate 10 serve as the first ONO film 20 between the bit lines 30 and as the second ONO film 22 on the bit line 30. On the bit line 30, since the upper silicon nitride film 16 and the second silicon nitride film 16 are identical, the same reference numerals are given.

Figure 7A:
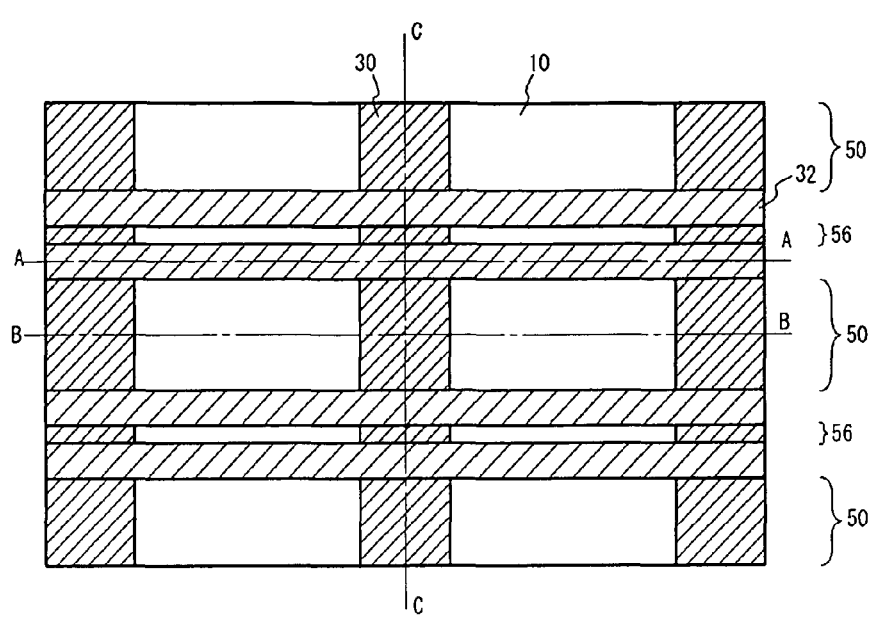
FIG. 7A is a top view illustration of a sixth step in a method for manufacturing a flash memory according to one embodiment of the present invention.
Figure 7D:
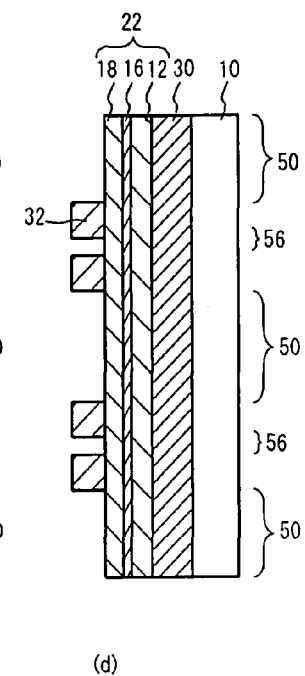
FIG. 7D is a cross-sectional view taken along the line C-C of a sixth step in a method for manufacturing a flash memory according to one embodiment of the present invention.
Figure 7B:
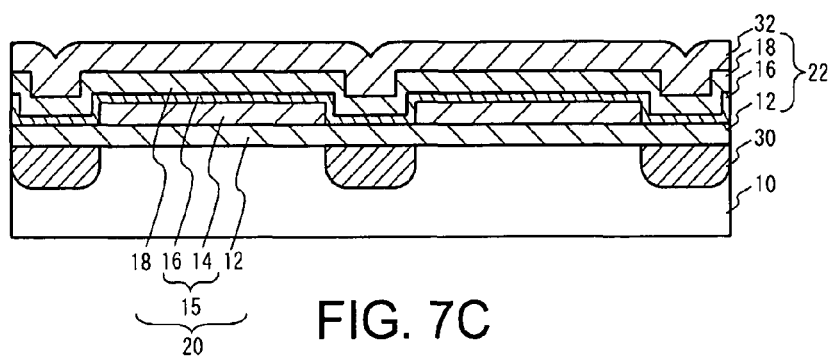
FIG. 7B is a cross-sectional view taken along the line A-A of a sixth step in a method for manufacturing a flash memory according to one embodiment of the present invention.
Figure 7C:
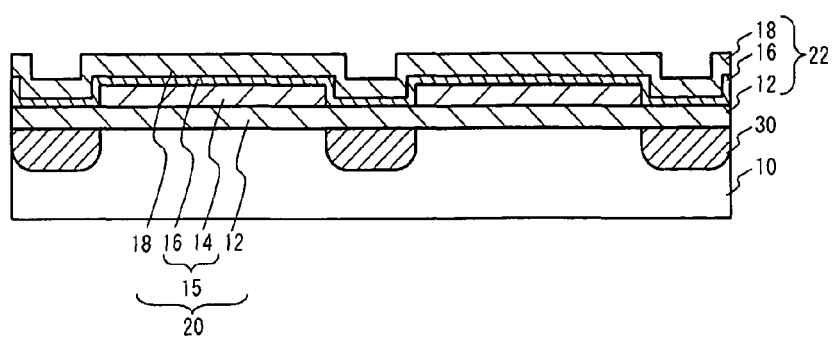
FIG. 7C is a cross-sectional view taken along the line B-B of a sixth step in a method for manufacturing a flash memory according to one embodiment of the present invention.

With reference to FIGS. 7A to 7D, a polycrystalline silicon film is formed on the second silicon oxide film 18 by using a CVD method. By etching the polycrystalline silicon film in a predefined area using exposure technology and etching technology, a word line 32 that crosses the bit line 30 and extends in a width direction of the bit line 30 is formed on the first ONO film 20 and on the second ONO film 22. With reference to FIGS. 7A and 7D, a wide spaced area between the word lines 32 is a bit line contact area 50 where a plug metal coupled to the bit line 30 is to be formed. The area 50 is disposed in every two word lines 32. More specifically, the area 50 is disposed in every ten or more word lines 32. However, in the subsequent drawings, the word lines 32 are shown as abbreviated to two lines.

Figure 8A:
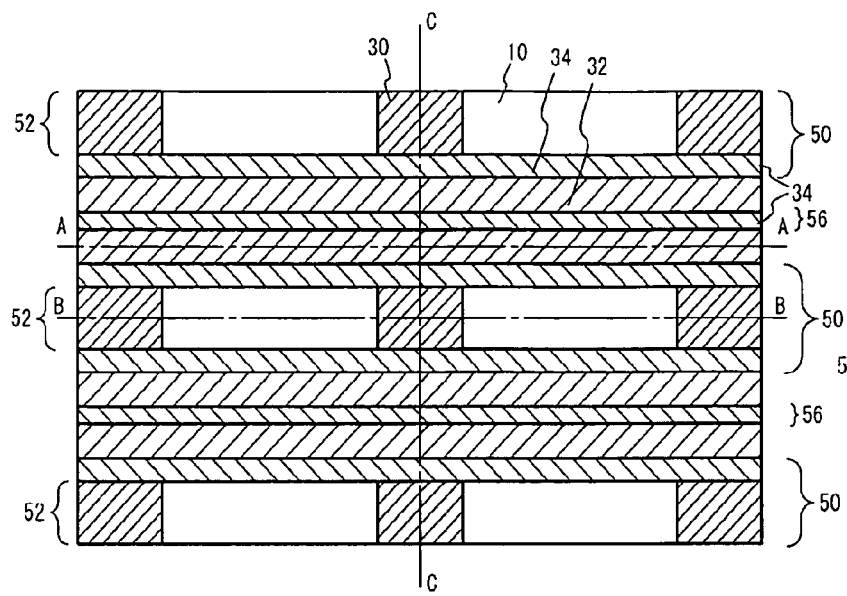
FIG. 8A is a top view illustration of a seventh step in a method for manufacturing a flash memory according to one embodiment of the present invention.
Figure 8D:
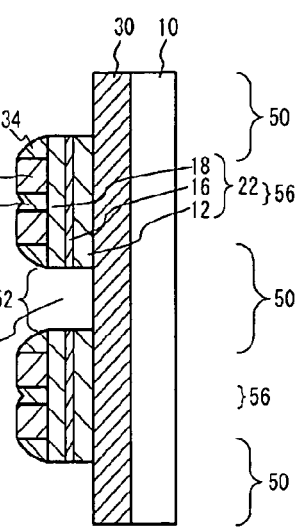
FIG. 8D is a cross-sectional view taken along the line C-C of a seventh step in a method for manufacturing a flash memory according to one embodiment of the present invention.
Figure 8B:
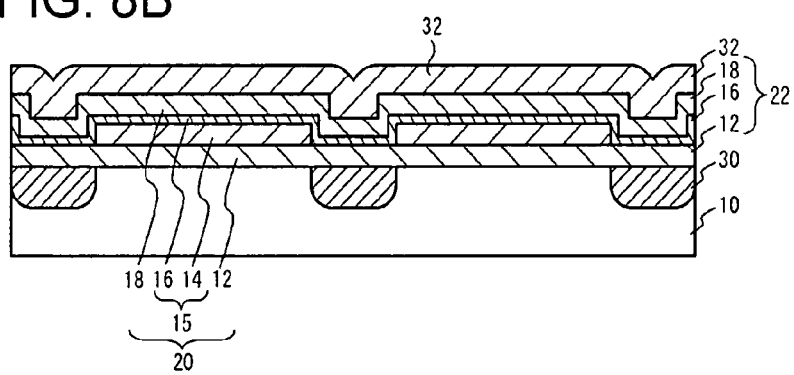
FIG. 8B is a cross-sectional view taken along the line A-A of a seventh step in a method for manufacturing a flash memory according to one embodiment of the present invention.
Figure 8C:
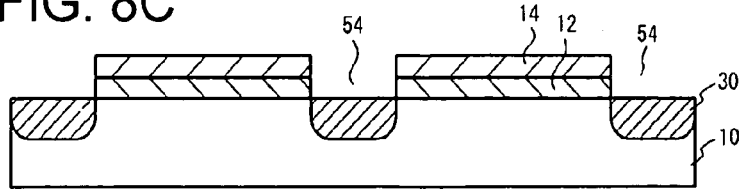
FIG. 8C is a cross-sectional view taken along the line B-B of a seventh step in a method for manufacturing a flash memory according to one embodiment of the present invention.

With reference to FIGS. 8A to 8D, a silicon nitride film is formed on the word line 32 and on the second silicon oxide film 18 by using high density plasma CVD. The silicon nitride film is overall etched so that a side wall 34 remains on the side of the word line 32. In this case, as shown in FIGS. 8A and 8D, since the space between the word lines 32 is wide in the bit line contact area 50, the side wall 34 is formed on the side of the word line 32 and there exits an area 52 where the side wall 34 is not formed. Meanwhile, in the areas other than the area 50, since the space between the word lines 32 is narrow, the side walls 34 on the sides of the word lines 32 are adjoined to each other.

Figure 9A:
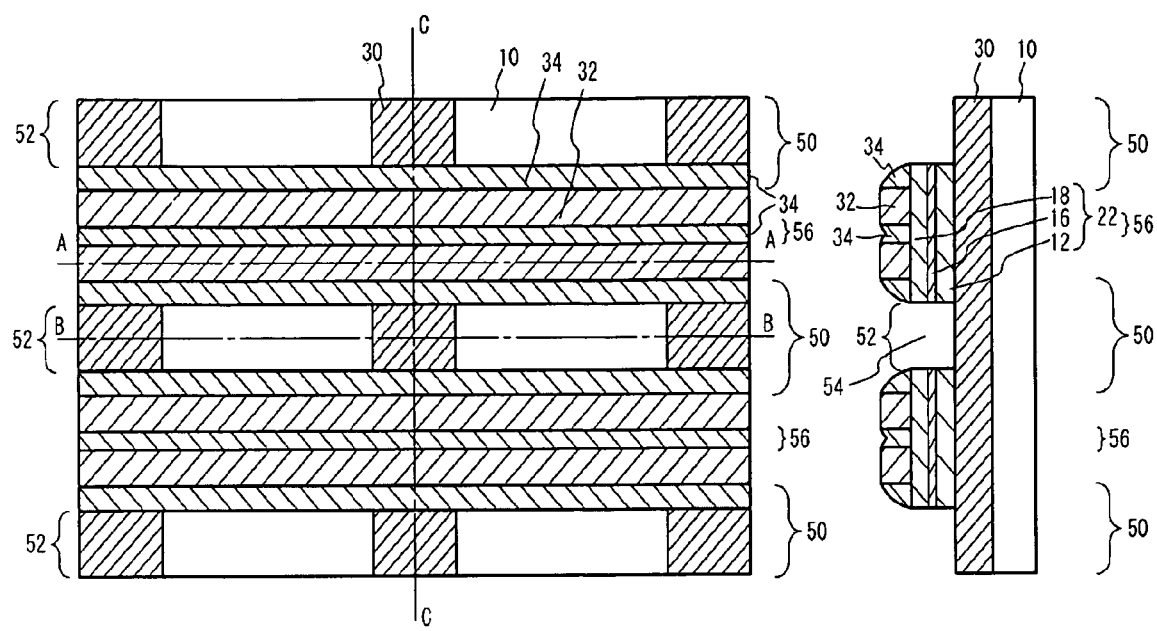
FIG. 9A is a top view illustration of a eighth step in a method for manufacturing a flash memory according to one embodiment of the present invention.
Figure 9D:
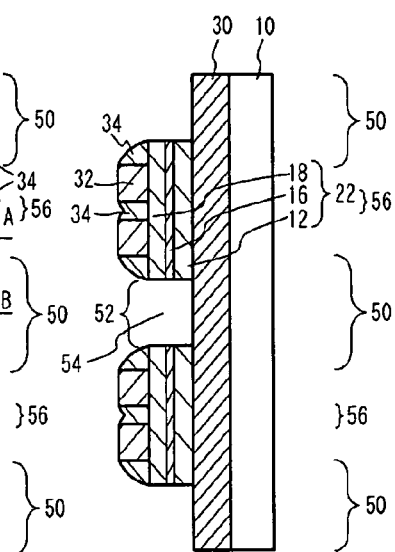
FIG. 9D is a cross-sectional view taken along the line C-C of a eighth step in a method for manufacturing a flash memory according to one embodiment of the present invention.
Figure 9B:
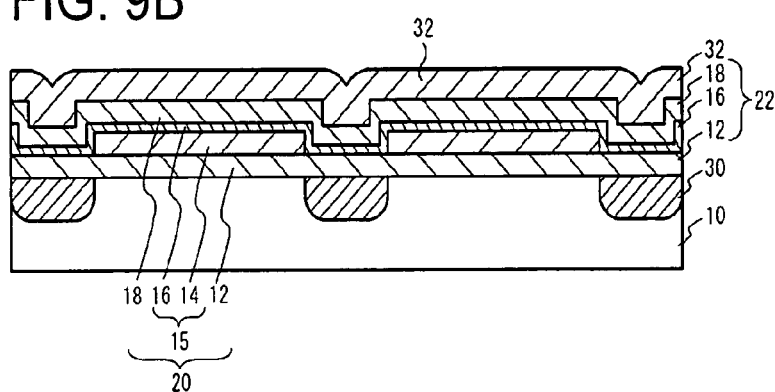
FIG. 9B is a cross-sectional view taken along the line A-A of a eighth step in a method for manufacturing a flash memory according to one embodiment of the present invention.
Figure 9C:
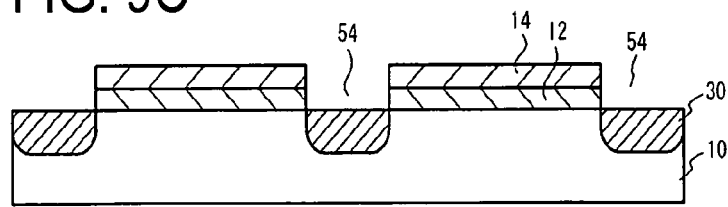
FIG. 9C is a cross-sectional view taken along the line B-B of a eighth step in a method for manufacturing a flash memory according to one embodiment of the present invention.

With reference to FIGS. 9A to 9D, the second silicon oxide film 18 in the area 52 is etched with the word line 32 and the side wall 34 as masks. Further, the upper silicon nitride film 16 is etched. In this case, care must be taken so that the lower silicon nitride film 14 formed between the bit lines 30 is not completely removed. Furthermore, the first silicon oxide film 12 is selectively etched against the silicon nitride film. With reference to FIG. 9C, in the area 52, the second ONO film 22 on the bit line 30 is removed and the bit line 30 is exposed. Meanwhile, on the semiconductor substrate 10 between the bit lines 30 in the area 52, the lower silicon nitride film 14 remains. As described above, an opening 54 in the ONO film is formed on the bit line 30 in the area 52. With reference to FIGS. 9B and 9D, the first ONO film 20 and the second ONO film 22 remain in the areas other than the area 52.

With reference to FIGS. 10A to 10D, cobalt is formed on the entire surface by using a sputtering method. By heat treatment, an upper portion of the word line 32 and an upper portion of the bit line 30 in the area 52 are silicified, and metal silicide layers 33 and 36 are respectively formed. In this case, in the areas other than the upper portion of the word line 32 and the bit line 30 in the area 52, cobalt is formed on the side wall 34 or on the lower silicon nitride film 14. As cobalt on a silicon nitride film is difficult to be silicify, the cobalt on the side wall 34 and the lower silicon nitride film 14 is not silicified. Thereafter, the cobalt not silicified is removed. Metals other than cobalt and titanium may also be used for silicification. The metal silicide layer 33 on the word line 32 is the layer which reduces the resistance of the word line 32.

With reference to FIGS. 11A to 11D, the interlayer insulation film 40 of a silicon oxide film is formed on the metal silicide layers 36 and 33, the side wall 34 and the lower silicon nitride film 14, by using, for example, a TEOS method. A contact hole which is coupled to the metal silicide layer 36 is formed in the interlayer insulation film 40. In the contact hole, a plug metal 38 of tungsten and such is formed. With reference to FIGS. 12A to 12D, on the interlayer insulation film 40, a wiring layer 42 coupled to the plug metal 38 and extending in an extending direction of the bit line 30 is formed. A protective film 44 is formed on the wiring layer 42 and the interlayer insulation film 40.

Figure 12A:
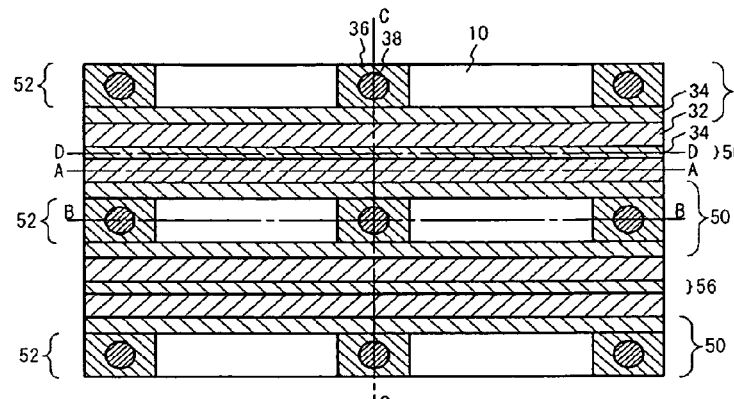
FIG. 12A is a top view illustration of a eleventh step in a method for manufacturing a flash memory according to one embodiment of the present invention.
Figure 12D:
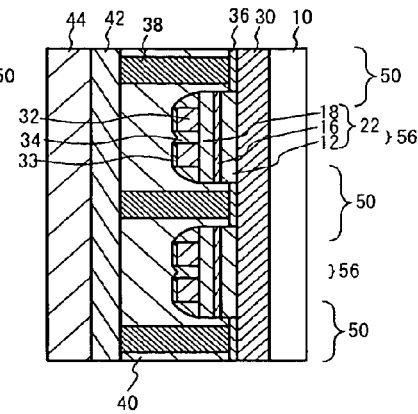
FIG. 12D is a cross-sectional view taken along the line C-C of a eleventh step in a method for manufacturing a flash memory according to one embodiment of the present invention.
Figure 13:
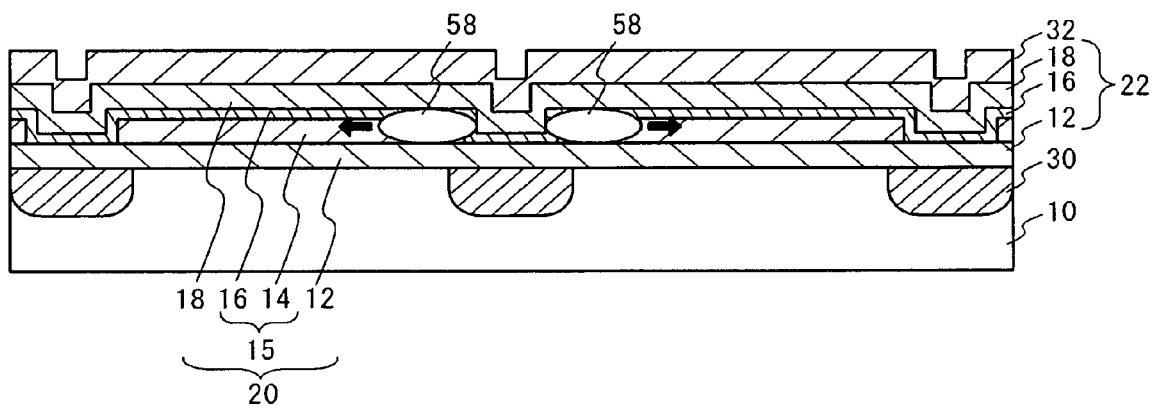
FIG. 13 is an alternate illustration of the cross-sectional view taken along the line A-A in FIG. 12A of the flash memory of the first embodiment.

FIG. 13 is an illustration equivalent to the cross-sectional view taken along the line A-A in FIG. 12A of the flash memory of the first embodiment. The bit line 30 is disposed in the semiconductor substrate 10. The first ONO film 20 is disposed on the semiconductor substrate 10 between the bit lines 30, and the second ONO film 22 is disposed on the bit line 30. The film thickness of the first silicon nitride film 15 in the first ONO film 20 is larger than the film thickness of the second silicon nitride film 16 in the second ONO film 22. Therefore, the diffusion of electric charges 58 stored in the thick first silicon nitride film 15 in the neighborhood of the bit line 30 towards the thin second silicon nitride film 16 on the bit line 30 can be prevented. Furthermore, in FIG. 6B, when forming the second silicon oxide film 18, the upper silicon nitride film 16 is disposed on the bit line 30. Therefore, the upper silicon nitride film 16 prevents oxygen from diffusing and prevents the bit line 30 from being oxidized. If the upper silicon nitride film 16 were not disposed, then the bit line 30 would be oxidized via the first silicon oxide film 12 and the film thickness of the silicon oxide film on the bit line 30 would be made larger. The oxidization would also progress in a horizontal direction.

With reference to FIG. 13, in one embodiment, the first silicon nitride film 15 includes the upper silicon nitride film 16 and the lower silicon nitride film 14, and the upper silicon nitride film 16 and the second silicon nitride film 16 is of equivalent film quality, while the film qualities of the lower silicon nitride film 14 and the second silicon nitride film 16, i.e. the upper silicon nitride film 16, may be different. By making the film quality of the upper silicon nitride film 16 different from that of the lower silicon nitride film 14, for example, the trap density of the upper silicon nitride film 16 (i.e., the second silicon nitride film 16) used to trap electric charges can be made smaller than that of the lower silicon nitride film 14. Consequently, since the trap density of the second silicon nitride film 16 on the bit line 30 is small, the diffusion of the electric charges 58 from the first silicon nitride film 15 can be further prevented. In the previous embodiment, by setting the temperature when forming the upper silicon nitride film 16 higher than the temperature set when forming the lower silicon nitride film 14, the trap density of the upper silicon nitride film 16 to trap electric charges is reduced. The film qualities of the upper silicon nitride film 16 and the lower silicon nitride film 14 may be altered by other conditions to deposit a silicon nitride film.

In a further embodiment, the method for manufacturing the flash memory of the first embodiment, the first silicon nitride film 15 and the second silicon nitride film 16 are formed as described below. As shown in FIG. 4B, the lower silicon nitride film 14 is removed with the photoresist 60 (a mask layer) formed on the lower silicon nitride film 14 as a mask and, as shown in FIG. 5B, with the same photoresist 60 as a mask, the bit line 30 is formed in the semiconductor substrate 10. Then, on the lower silicon nitride film 14 and on the bit line 30, the upper silicon nitride film 16 is formed. By such manufacturing processes, the process to reduce the thickness of the second silicon nitride film 16 on the bit line 30 and the process to form the bit line 30 can be carried out in a self-aligned manner. Thus, misalignment can be prevented and the manufacturing process can be reduced.

According to some embodiments, the flash memory has the metal silicide layer 36, which is disposed on the bit line 30 and in the opening 54 of the second ONO film 22, and the plug metal 38 (a coupling metal layer) directly coupled to the metal silicide layer 36. Consequently, the contact resistance between the plug metal 38 and the bit line 30 can be reduced.

According to further embodiments, the metal silicide layer 36 is disposed between the word lines 32. Furthermore, the side wall 34 is disposed on the side of the word line 32, and the metal silicide layer 36 is disposed between the side walls 34. As described above, the metal silicide layer 36 can be formed in the bit line contact area 50. The reasons for providing the bit line contact area 50 is as described below. The bit line 30 is formed by a diffusion layer. Consequently, the resistance becomes high. Therefore, by providing the bit line contact area 50, the bit line 30 and the wiring layer of a lower resistance are coupled in every case where the bit line 30 crosses a plurality of word lines 32. Furthermore, by providing the bit line contact area 50 in an extending direction of the word line 32, the chip area of the semiconductor device can be reduced.

In one embodiment, as shown in FIG. 6B, the first silicon nitride film 15 is formed in the area to be between the bit lines 30 on the semiconductor substrate 10 and, as shown in FIGS. 4B to 6B, the second silicon nitride film 16 of which film thickness is smaller than the first silicon nitride film 15 is formed in the area to be the bit line 30 on the semiconductor substrate 10. As shown in FIG. 9C, the first silicon nitride film 15 and the second silicon nitride film 16 are etched between the word lines 32, so as to make the first silicon nitride film 15 between the bit lines 30 remain and the second silicon nitride film 16 on the bit line 30 be removed. As described above, since the first silicon nitride film 15 remains on the surface between the word lines 32 and between the bit lines 30, the metal silicide layer 36 is not formed on the first silicon nitride film 15, and the metal silicide layer 36 can be selectively formed on the bit line 30 between the word lines 32.

As shown in FIG. 8D, the side wall 34 is formed on the side of the word line 32 and, as shown in FIGS. 9C and 9D, the second silicon nitride film 16 between the side walls 34 is etched. Thus, the metal silicide layer 36 can be selectively formed in the area 52 between the side walls 34 on the bit line 30.

Further, as shown in FIG. 2B, the lower silicon nitride film 14 is formed on the semiconductor substrate 10. As shown in FIG. 4B, the lower silicon nitride film 14 is removed with the photoresist 60 (the mask layer) formed on the lower silicon nitride film 14 as a mask. As shown in FIG. 6B, the upper silicon nitride film 16 is formed on the first silicon nitride film 15 and on the first silicon oxide film 12 (e.g., on the semiconductor substrate 10). Thus, the second silicon nitride film 16 is formed. As shown in FIG. 6B, forming of the second silicon nitride film 16 is performed by forming the upper silicon nitride film 16. Consequently, the second silicon nitride film 16 having a smaller film thickness than the first silicon nitride film 15 can be easily formed.

As shown in FIG. 5B, the bit line 30 may be formed in the semiconductor substrate 10 with the photoresist 60 (the mask layer) as a mask. Therefore, the process to reduce the thickness of the second silicon nitride film 16 on the bit line 30 and the process to form the bit line 30 can be carried out in a self-aligned manner. Thus, misalignment can be prevented and the manufacturing process can be reduced.

Figure 12B:
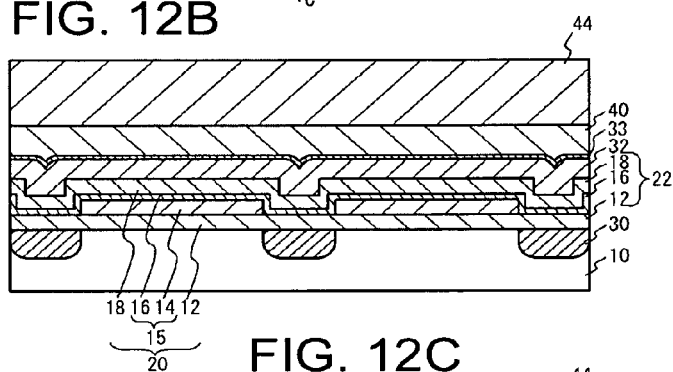
FIG. 12B is a cross-sectional view taken along the line A-A of a eleventh step in a method for manufacturing a flash memory according to one embodiment of the present invention.
Figure 12C:
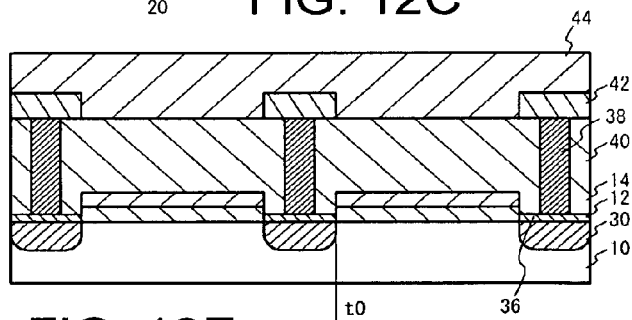
FIG. 12C is a cross-sectional view taken along the line B-B of a eleventh step in a method for manufacturing a flash memory according to one embodiment of the present invention.

In the semiconductor device manufactured as described above, as shown in FIG. 12E, the first ONO film 20 is disposed in the area 52 between the bit lines 30 on the semiconductor substrate 10, and the second ONO film 22 is disposed on the bit line 30. As shown in FIG. 12C, the metal silicide layer 36 is disposed in the opening of the ONO film on the bit line 30. Further, the coupling metal layer directly coupled to the metal silicide layer 36 is disposed.

Figure 12E:
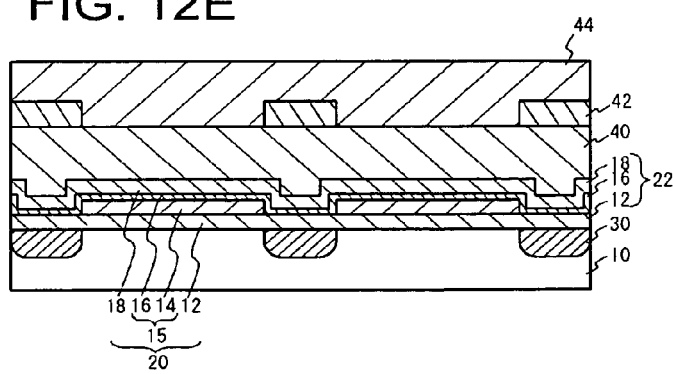
FIG. 12E is a cross-sectional view taken along the line D-D of a eleventh step in a method for manufacturing a flash memory according to one embodiment of the present invention.

As shown in FIG. 12E, the first ONO film 20 may be formed in the area 56 (e.g., between the word lines 32 where the plug metal 38 is not disposed between the bit lines 30) on the semiconductor substrate 10, and the second ONO film 22 is formed on the bit line 30. As shown in FIG. 12B, in the area 50, (e.g., between the word lines 32 where the plug metal 38 is disposed), the first silicon nitride film 15 and the first silicon oxide film 12 in the first ONO film 20 are formed between the bit lines 30 on the semiconductor substrate 10, and the metal silicide layer 36 is formed on the bit line 30. Consequently, since the metal silicide layer 36 can be selectively formed only in the area where the plug metal 38 is formed, miniaturization of memory cells can be achieved.

Figure 14A:
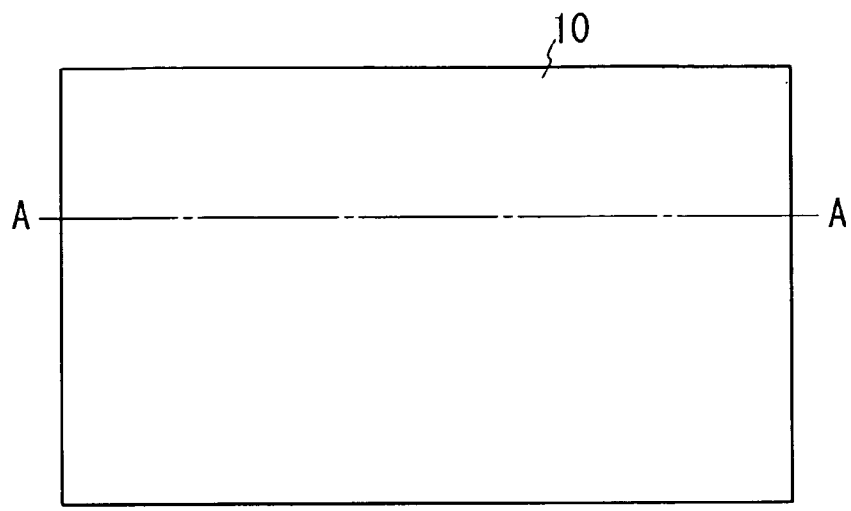
FIG. 14A is a top view illustration of a first step in a method for manufacturing a flash memory according to another embodiment of the present invention.

FIGS. 14A to 21D are top views and cross-sectional views to illustrate the method for manufacturing a flash memory according to another embodiment. With reference to FIGS. 14A and 14B, a first silicon oxide film 12 of a film thickness of approximately 7 nm is formed as a tunnel oxide film on a p-type silicon semiconductor substrate 10 (or a p-type domain in a silicon semiconductor substrate), by a thermal oxidation method. A third silicon nitride film 15a of a film thickness of approximately 10 nm is formed on the first silicon oxide film 12, as a trap layer by a CVD method.

With reference to FIGS. 15A to 15C, a photoresist 60 is coated on the third silicon nitride film 15a, and by using exposure and developing technologies, an opening 64 is formed in the area where a bit line is to be formed. With the photoresist 60 as a mask, for example, arsenic is implanted and thereafter, by heat treatment, a bit line 30 of an n-type domain is formed in the semiconductor substrate 10. A width of the bit line 30 is, for example, 150 nm, and the space between the bit lines 30 is, for example, 200 nm.

Figure 16A:
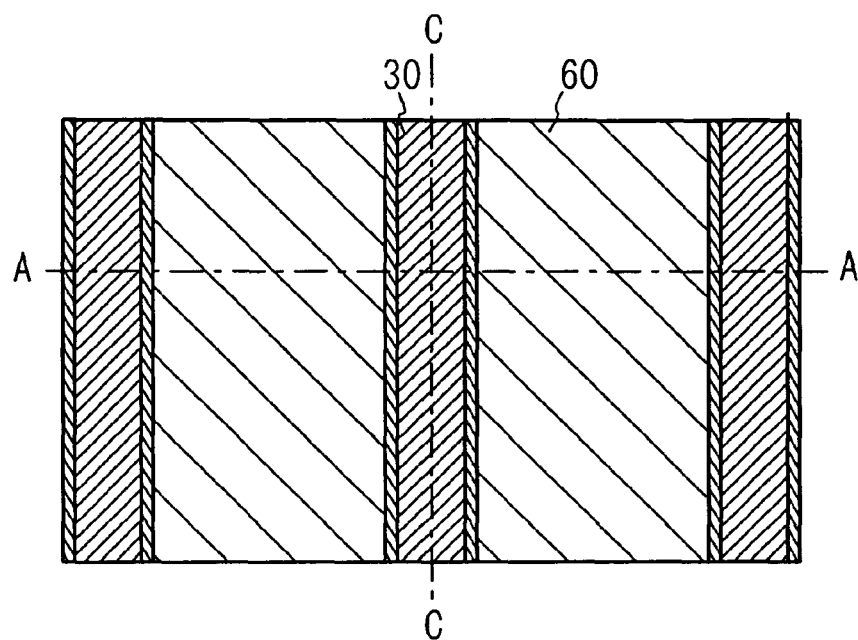
FIG. 16A is a top view illustration of a third step in a method for manufacturing a flash memory according to another embodiment of the present invention.
Figure 16C:
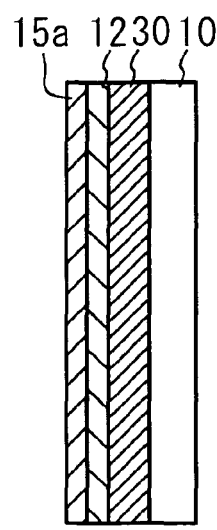
FIG. 16C is a cross-sectional view taken along the line C-C of a third step in a method for manufacturing a flash memory according to another embodiment of the present invention.
Figure 16B:
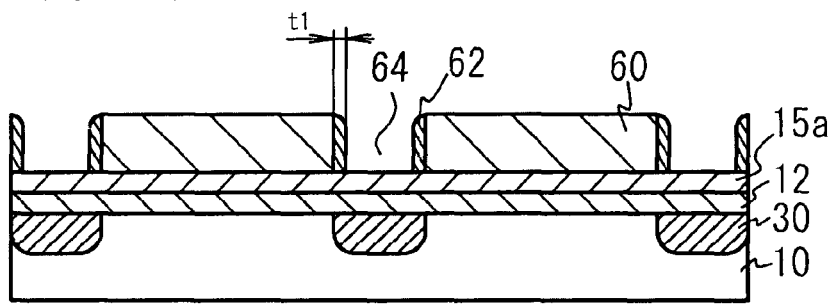
FIG. 16B is a cross-sectional view taken along the line A-A of a third step in a method for manufacturing a flash memory according to another embodiment of the present invention.

With reference to FIGS. 16A to 16C, a polymer layer mainly composed of carbon and fluorine is formed by using a dry etching device under the condition of depositing by-products, so as to cover the photoresist 60. By anisotropic etching, a spacer 62 formed of a polymer is formed on the side of the photoresist 60. A width t1 of the spacer 62 is, for example, from 10 to 20 nm.

Figure 17A:
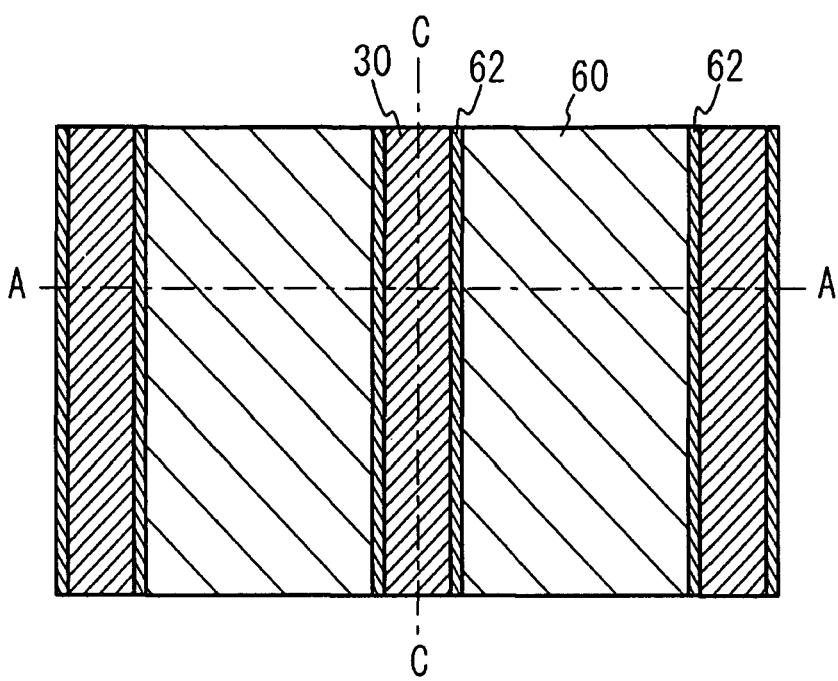
FIG. 17A is a top view illustration of a fourth step in a method for manufacturing a flash memory according to another embodiment of the present invention.
Figure 17C:
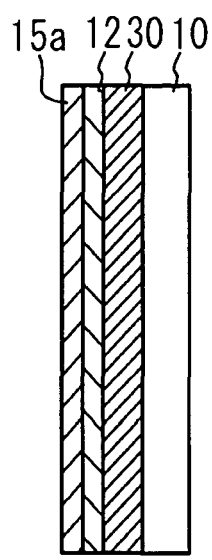
FIG. 17C is a cross-sectional view taken along the line C-C of a fourth step in a method for manufacturing a flash memory according to another embodiment of the present invention.
Figure 17B:
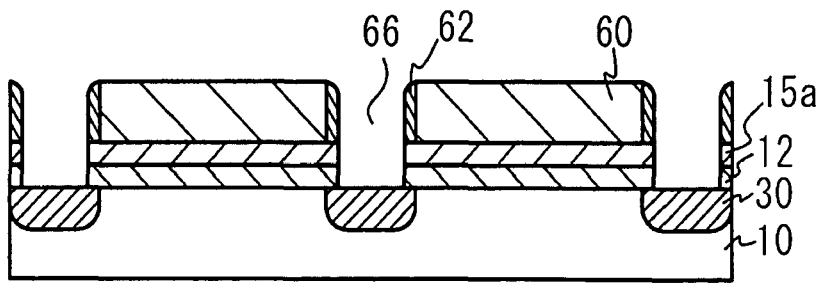
FIG. 17B is a cross-sectional view taken along the line A-A of a fourth step in a method for manufacturing a flash memory according to another embodiment of the present invention.

With reference to FIGS. 17A to 17C, with the photoresist 60 and the spacer 62 as masks, the third silicon nitride film 15a and the first silicon oxide film 12 on the bit line 30 are removed by etching. By anisotropic etching of the third silicon nitride film 15a and the first silicon oxide film 12, edges of an opening 66 in the third silicon nitride film 15a and the first silicon oxide film 12 can be formed approximately the width t1 of the spacer 62 inward from the edge of the bit line 30.

Figure 18A:
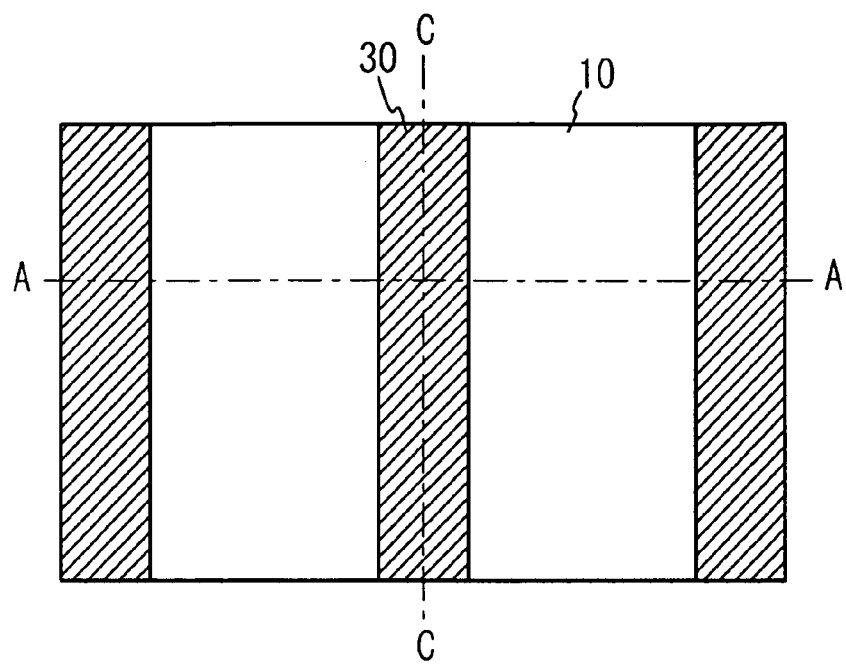
FIG. 18A is a top view illustration of a fifth step in a method for manufacturing a flash memory according to another embodiment of the present invention.
Figure 18C:
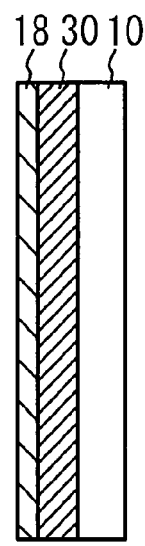
FIG. 18C is a cross-sectional view taken along the line C-C of a fifth step in a method for manufacturing a flash memory according to another embodiment of the present invention.
Figure 18B:
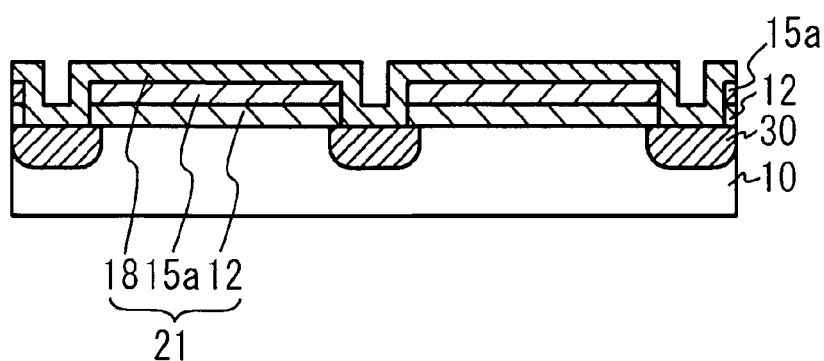
FIG. 18B is a cross-sectional view taken along the line A-A of a fifth step in a method for manufacturing a flash memory according to another embodiment of the present invention.

With reference to FIGS. 18A to 18C, the photoresist 60 and the spacer 62 are removed. A second silicon oxide film 18 is formed as a top oxide film on the bit line 30 and on the third silicon nitride film 15a between the bit lines 30 by using the CVD method. Consequently, on the semiconductor substrate 10 between the bit lines 30, an ONO film 21 composed of the first silicon oxide film 12, the third silicon nitride film 15a and the second silicon oxide film 18 is formed.

With reference to FIGS. 19A to 19D, a polycrystalline silicon film is formed on the second silicon oxide film 18 by using the CVD method. By etching the polycrystalline silicon film in a predefined area using exposure technology and etching technology, a word line 32 that crosses the bit line 30 and extends in a width direction of the bit line 30 is formed on the ONO film 21. With reference to FIGS. 19A and 19D, a wide spaced area between the word lines 32 is a bit line contact area 50 where a plug metal coupled to the bit line 30 is to be formed. As depicted in FIG. 19A, in one embodiment the bit line contact area 50 is disposed in every two word lines 32. The actual bit line contact area 50 may be disposed in every ten or more word lines 32. However, in the subsequent drawings, the word lines 32 are shown as abbreviated to two lines. An area 56 is disposed between the word lines 32 where the plug metal is not formed is With reference to FIGS. 20A to 20D, a silicon nitride film is formed on the word line 32 and on the second silicon oxide film 18 by using high density plasma CVD. A side wall 34 is made to remain on the side of the word line 32 by overall etching the silicon nitride film. In this case, as shown in FIGS.

20A and 20D, since the space between the word lines 32 in the bit line contact area 50 is wide, the side wall 34 is formed on the side of the word line 32 area 52 depicts the area where the side wall 34 is not formed. Meanwhile, since the space between the word lines 32 is narrower in the area 56, the side walls 34 on the sides of the word lines 32 are adjoined to each other.

Figure 21A:
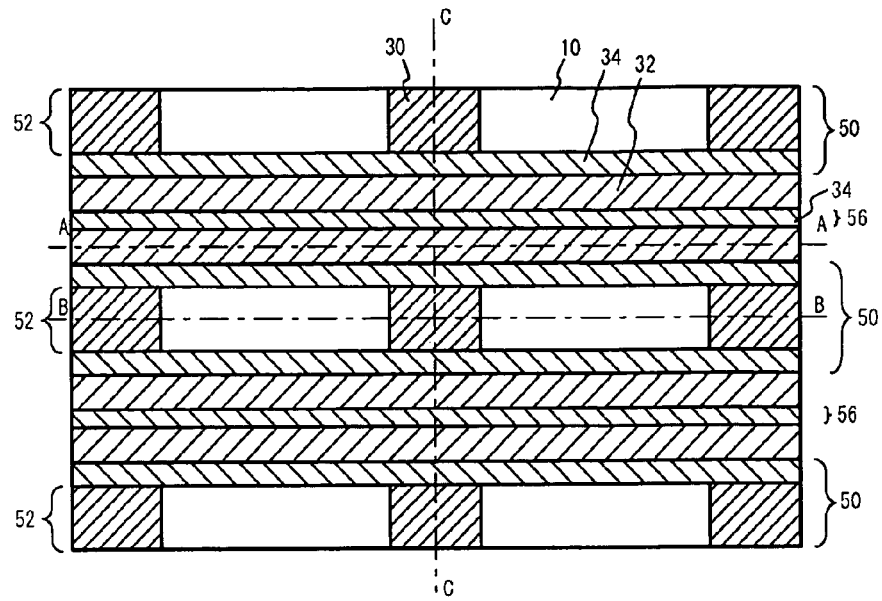
FIG. 21A is a top view illustration of a eighth step in a method for manufacturing a flash memory according to another embodiment of the present invention.
Figure 21D:
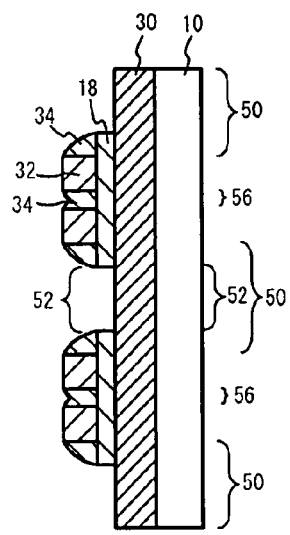
FIG. 21D is a cross-sectional view taken along the line C-C of a eighth step in a method for manufacturing a flash memory according to another embodiment of the present invention.
Figure 21B:
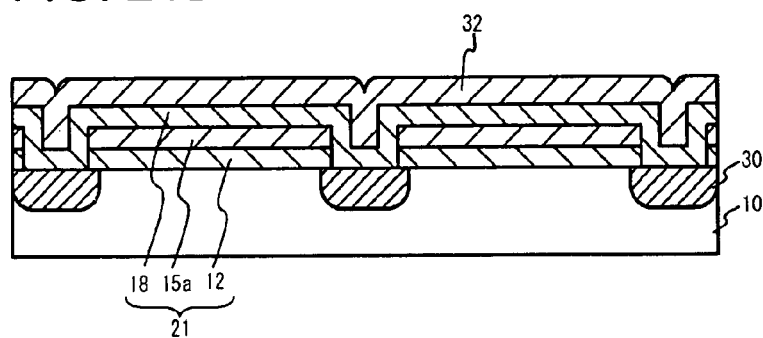
FIG. 21B is a cross-sectional view taken along the line A-A of a eighth step in a method for manufacturing a flash memory according to another embodiment of the present invention.
Figure 21C:
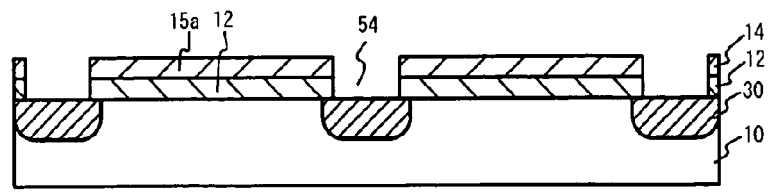
FIG. 21C is a cross-sectional view taken along the line B-B of a eighth step in a method for manufacturing a flash memory according to another embodiment of the present invention.
Figure 22A:
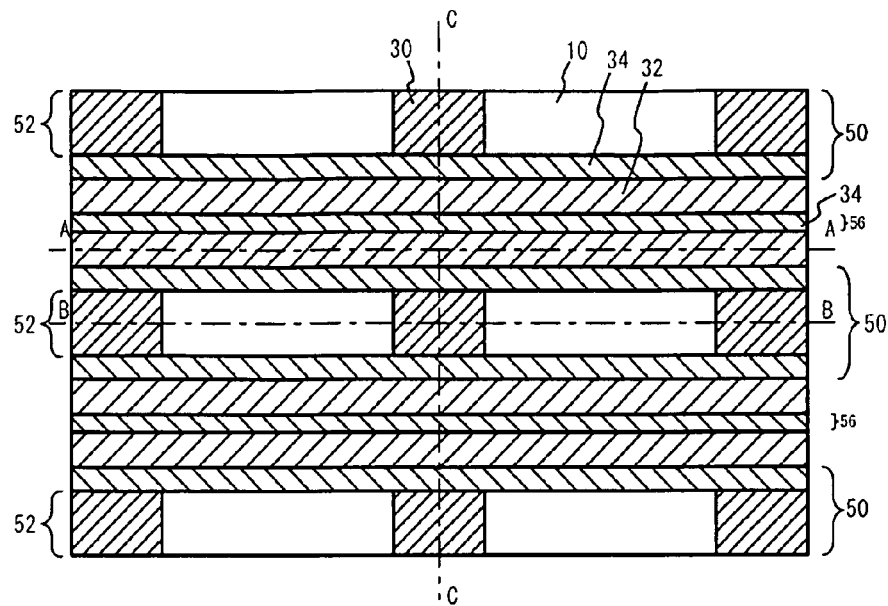
FIG. 22A is a top view illustration of a ninth step in a method for manufacturing a flash memory according to another embodiment of the present invention.
Figure 22D:
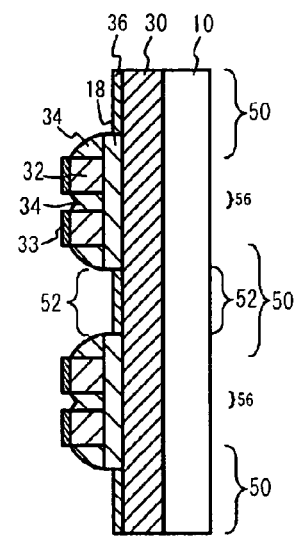
FIG. 22D is a cross-sectional view taken along the line C-C of a ninth step in a method for manufacturing a flash memory according to another embodiment of the present invention.
Figure 22B:
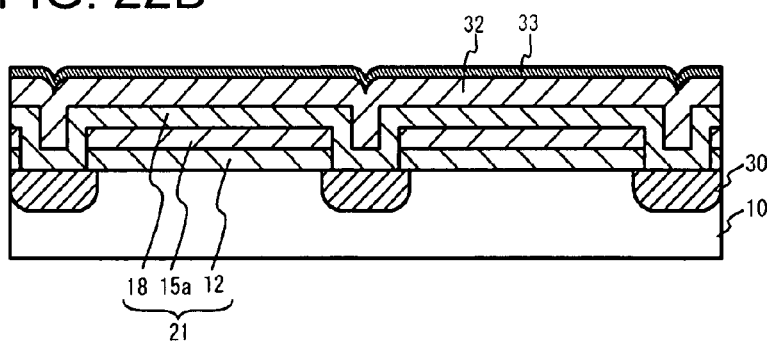
FIG. 22B is a cross-sectional view taken along the line A-A of a ninth step in a method for manufacturing a flash memory according to another embodiment of the present invention.
Figure 22C:
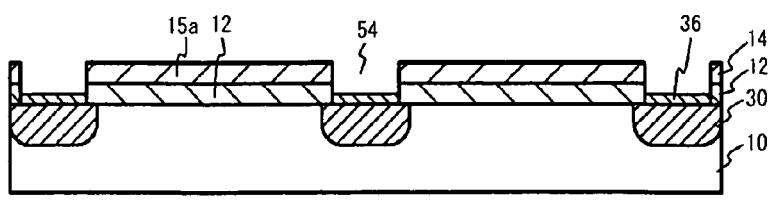
FIG. 22C is a cross-sectional view taken along the line B-B of a ninth step in a method for manufacturing a flash memory according to another embodiment of the present invention.

With reference to FIGS. 21A to 21D, with the word line 32 and the side wall 34 as masks, the second silicon oxide film 18 in the area 52 is etched. With reference to FIG. 21C, in the area 52, the second silicon oxide film 18 on the bit line 30 is removed and the bit line 30 is exposed. Meanwhile, on the semiconductor substrate 10 between the bit lines 30, the third silicon nitride film 15a remains. As described above, an opening 54 in the ONO film is formed on the bit line 30 in the area 52. With reference to FIGS. 21B and 21D, in the areas other than the area 52, the first ONO film 21 or the second silicon oxide film 18 remain.

With reference to FIGS. 22A to 22D, in one embodiment cobalt is formed on the entire surface by using a sputtering method. By heat treatment, an upper portion of the word line 32 and an upper portion of the bit line 30 in the area 52 are silicified, and metal silicide layers 33 and 36 are respectively formed. According to this embodiment, cobalt is formed on the side wall 34 or on the third silicon nitride film 15a in the areas other than the upper portion of the word line 32 and the bit line 30 in the area 52. As cobalt on a silicon nitride film difficult to silicify, the cobalt on the side wall 34 and the third silicon nitride film 15a is not silicified. Thereafter, the cobalt not silicified is removed. Metals other than cobalt, titanium and such may also be used for silification.

With reference to FIGS. 23A to 23E, an interlayer insulation film 40 is formed and a contact hole coupled to the metal silicide layer 36 is formed in the same manner as described with reference to FIGS. 11A to 12D. A plug metal 38 of tungsten and such is formed in the contact hole. A wiring layer 42 and a protective film 44 are formed.

Figure 14B:
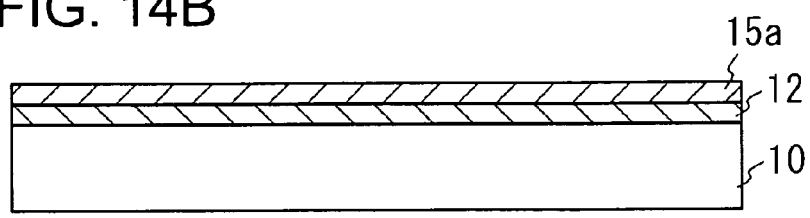
FIG. 14B is a cross-sectional view taken along the line A-A of a first step in a method for manufacturing a flash memory according to another embodiment of the present invention.

According to another embodiment, as shown in FIG. 14B, the third silicon nitride film 15a is formed on the semiconductor substrate 10 via the first silicon oxide film 12. As shown in FIGS. 15A to 15C, the bit line 30 may be formed in the semiconductor substrate 10 with the photoresist 60 (a second mask layer) formed on the third silicon nitride film 15a as a mask. As shown in FIGS. 16A to 16C, the spacer 62 is formed on the side of the photoresist 60. As shown in FIGS. 17A to 17C, the third silicon nitride film 15a and the first silicon oxide film 12 are removed with the photoresist 60 and the spacer 62 as masks. As shown in FIGS. 22A to 22D, the metal silicide layer 36 is formed on the bit line 30 with the third silicon nitride film 15a as a mask. Thus, the metal silicide layer 36 can be formed, with the edge of the metal silicide layer 36 being offset inward from the edge of the bit line 30 by the amount equivalent to the width of the spacer 62.

According to one embodiment, as shown as t0 in FIG. 12C, edges of the bit line 30 and the metal silicide layer 36 only have an offset of no more than the amount of diffusion of the bit line 30 in a horizontal direction. In this case, there is a possibility of the metal silicide layer 36 also being formed on the p-type semiconductor substrate 10. According to the second embodiment, since the edges of the bit line 30 and the metal silicide layer 36 are offset, it is possible to prevent the metal silicide layer 36 from being formed on the p-type semiconductor substrate 10.

Subsequently, as shown in FIGS. 18A to 18C, the second silicon oxide film 18 is formed on the third silicon nitride film 15a between the bit lines 30 and on the bit line 30 where the third silicon nitride film 15a and the first silicon oxide film 12 have been removed. As shown in FIGS. 19A to 19D, on the second silicon oxide film 18, the word line 32 is formed crossing the bit line 30. As shown in FIGS. 21A to 21D, the second silicon oxide film 18 between the word lines 32 is removed. Then, as shown in FIGS. 22A to 22D, the metal silicide layer 36 is formed between the word lines 32, (e.g., in the area 52). Consequently, the metal silicide layer 36 can be selectively formed on the bit line 30 between the word lines 32. Further, since the second silicon oxide film 18 is formed under the word line 32 on the bit line 30, the word line 32 and the bit line 30 will not be short-circuited. Furthermore, since the second silicon oxide film 18 also serves as a top oxide film of the ONO film 21, the manufacturing process can be reduced.

The metal silicide layer 36 may be formed on the bit line 30 in the area 56. Consequently, the resistance of the bit line 30 can be reduced. However, in order to form the metal silicide layer 36 in the area 56, the space between the word lines 32 in the area 56 may need to be widened. Therefore, as shown in FIGS. 21A to 21D, when removing the second silicon oxide film 18, the second silicon oxide film 18 between the word lines 32 in the area 50 where the plug metal 38 is to be disposed is selectively removed. Further, as shown in FIGS. 22A to 22D, when forming the metal silicide layer 36, it is preferable to selectively form the metal silicide layer 36 on the bit line 30 between the word lines 32 in the area 50 where the plug metal 38 is to be disposed. Particularly, the metal silicide layer 36 is formed in the area 52 where a lower resistance of the surface of the bit line 30 is required and the plug metal 38 is to be disposed, and the metal silicide layer 36 is not formed in the area 56 where a lower resistance of the surface of the bit line 30 is not relatively required. Therefore, the space in the area 56 can be narrowed. Thus, miniaturization of memory cells can be achieved.

As shown in FIGS. 20A to 20D, between the word lines 32 in the area 56 is covered with the side wall 34, and the side of the word line 32 in the area 50 is covered with the side wall 34. Under this condition, as shown in FIGS. 21A to 21D, by selectively etching the second silicon oxide film 18 against the side wall 34, the third silicon nitride film 15a is exposed in the area 52 and the bit line 30 is exposed in the opening 54. As shown in FIGS. 22A to 22D, under this condition, the areas other than the opening 54 and on the word line 32 are covered with the nitride films of the side wall 34 and the second silicon nitride film 15a. Under this condition, the metal silicide layer 36 can be formed in the opening 54 on the bit line 30 and the metal silicide layer 33 can be formed on the word line 32.

While the photoresist 60 has been described as an example of the second mask layer, other insulation films or metal films may be used as the second mask layer. While the spacer 62 has been described as an example of a polymer layer, other materials may be used. However, in one embodiment as shown in FIGS. 16A to 16C, the second mask layer and the spacer 62 are formed on the third silicon nitride film 15a. When the second mask layer and the spacer 62 are formed by the other insulation films and such, the removal of the second mask layer and the spacer 62 may require harder etching. Consequently, the third silicon nitride film 15a of the trap layer is etched or the third silicon nitride film 15a may be damaged. Therefore, it is preferable to use the photoresist 60 as the second mask layer and the polymer layer as the spacer 62. The photoresist 60 and polymer can be selectively removed from the third silicon nitride film 15a by, for example, oxygen plasma. As a result, it is possible to prevent the third silicon nitride film 15a from being excessively etched or from being damaged.

Figure 23A:
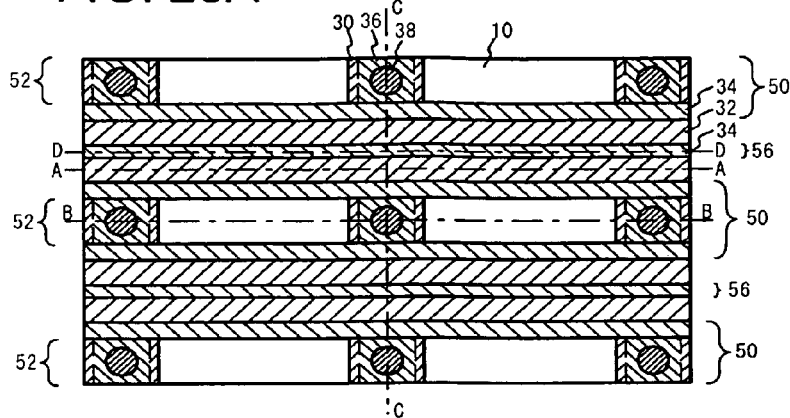
FIG. 23A is a top view illustration of a tenth step in a method for manufacturing a flash memory according to another embodiment of the present invention.
Figure 23D:
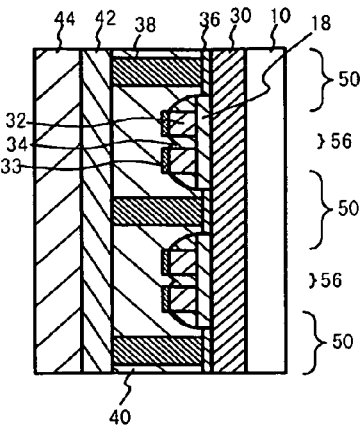
FIG. 23D is a cross-sectional view taken along the line C-C of a tenth step in a method for manufacturing a flash memory according to another embodiment of the present invention.
Figure 23B:
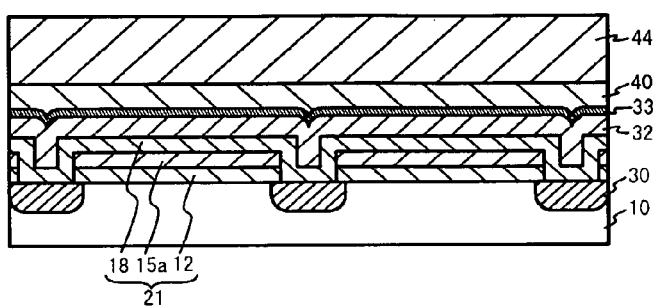
FIG. 23B is a cross-sectional view taken along the line A-A of a tenth step in a method for manufacturing a flash memory according to another embodiment of the present invention.
Figure 23C:
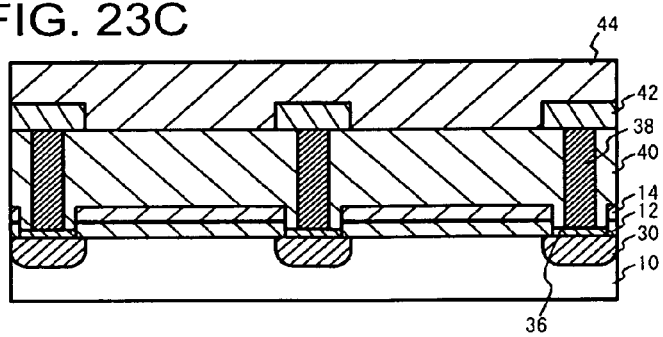
FIG. 23C is a cross-sectional view taken along the line B-B of a tenth step in a method for manufacturing a flash memory according to another embodiment of the present invention.

In the semiconductor device manufactured as described above, as shown in FIG. 23E, the ONO film 21 is disposed between the bit lines 30 in the area 56 on the semiconductor substrate 10, and the second silicon oxide film 18 in the ONO film 21 is directly disposed on the bit line 30. As shown in FIG. 23C, the metal silicide layer 36 is disposed in the opening in the ONO film 21, which is located on the bit line 30 and is offset from the edge of the bit line 30. Thereafter, the plug metal 38 directly coupled to the metal silicide layer 36 is disposed. Since the plug metal 38 contacts with the metal silicide layer 36, the contact resistance between the plug metal 38 and the bit line 30 can be reduced. Furthermore, since the metal silicide layer 36 is offset from the edge of the bit line 30, it is possible to prevent the metal silicide layer 36 from contacting the semiconductor substrate 10.

Figure 23E:
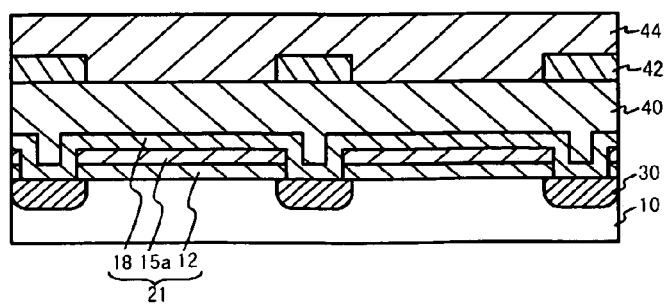
FIG. 23E is a cross-sectional view taken along the line D-D of a tenth step in a method for manufacturing a flash memory according to another embodiment of the present invention.

As shown in FIG. 23E, the ONO film 21 is formed between the bit lines 30 on the semiconductor substrate 10, and the second silicon oxide film 18 is formed on the bit line 30 in the area 56 (e.g., the area between the word lines 32 where the plug metal 38 is not disposed). As shown in FIG. 23C, the third silicon nitride film 15a and the first silicon oxide film 12 in the ONO film 21 are formed between the bit lines 30 on the semiconductor substrate 10, and the metal silicide layer 36 is formed on the bit line 30 in the area 52 (e.g., between the word lines 32 where the plug metal 38 is disposed). Consequently, since the metal silicide layer 36 can be selectively formed only in the area where the plug metal 38 is formed, miniaturization of memory cells can be achieved.

While the preceding embodiments describe exemplary embodiments where the word line 32 is formed of a polycrystalline silicon film and the plug metal 38 is formed of tungsten, they are not limited to these.

It is noted that the various embodiments of the invention described herein are applicable to voltage detector circuits and devices that utilize voltage detector circuits, such as flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 μA).

Figure 24:
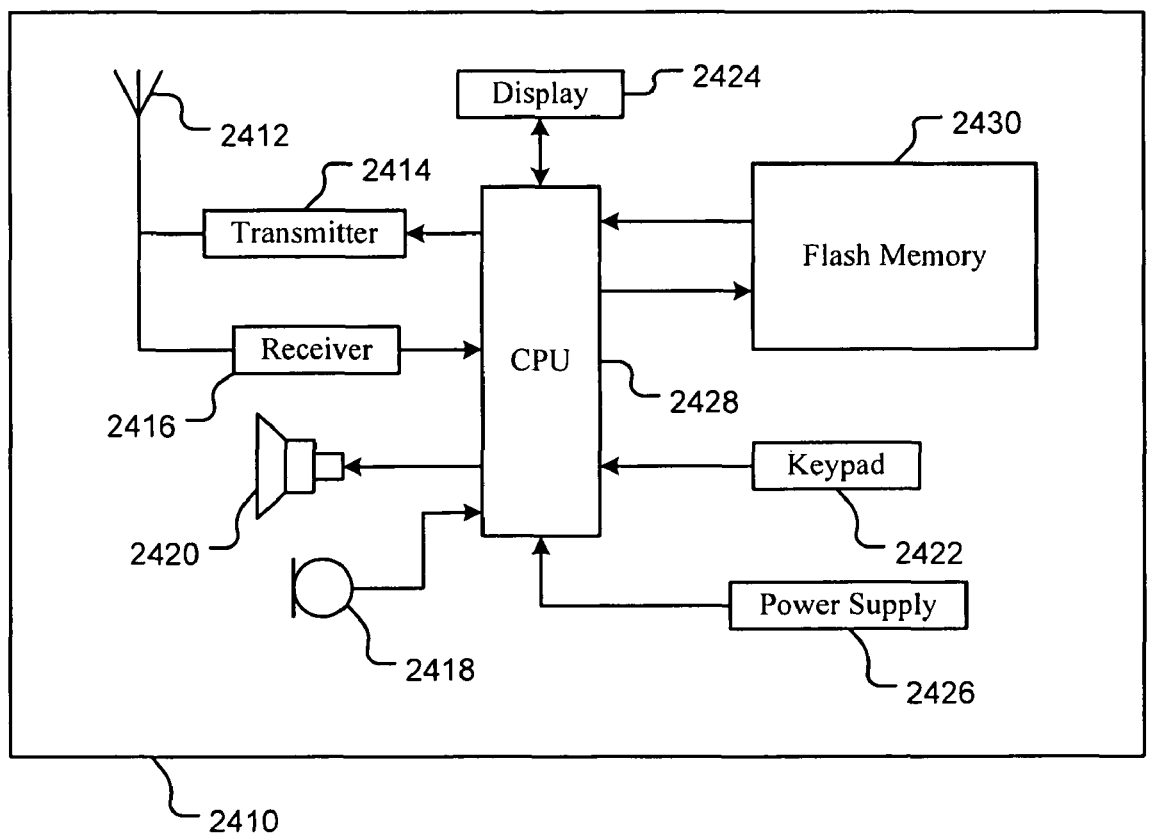
FIG. 24 illustrates a block diagram of an exemplary portable phone, upon which embodiments of the invention may be implemented.

FIG. 24 shows a block diagram of an exemplary portable telephone 2410 (e.g., cell phone, cellular phone, mobile phone, internet protocol phone, wireless phone, etc.), upon which various embodiments of the invention can be implemented. The cell phone 2410 includes an antenna 2412 coupled to a transmitter 2414 and a receiver 2416, as well as a microphone 2418, a speaker 2420, a keypad 2422, and a display 2424. The cell phone 2410 also includes a power supply 2426 and a central processing unit (CPU) 2428, which may be an embedded controller, conventional microprocessor, or the like. In addition, the cell phone 2410 includes integrated, flash memory 2430. Flash memory 2430 can include a nonvolatile memory device with a shorter distance between the bit lines and higher storage capacity and density than those conventionally known. In various embodiments, the flash memory 2430 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2412, 2414, 2416, 2422, 2428, 2430, etc.) of portable telephone 2410 can be coupled to each other in a wide variety of ways. For example, in an embodiment, the antenna 2412 can be coupled to transmitter 2414 and receiver 2416. Additionally, the transmitter 2414, receiver 2416, speaker 2420, microphone 2418, power supply 2426, keypad 2422, flash memory 2430 and display 2424 can each be coupled to the processor (CPU) 2428. It is pointed out that in various embodiments, the components of portable telephone 2410 can be coupled to each other via, but are not limited to, one or more communication buses, one or more data buses, one or more wireless communication technologies, one or more wired communication technologies, or any combination thereof.

Figure 25:
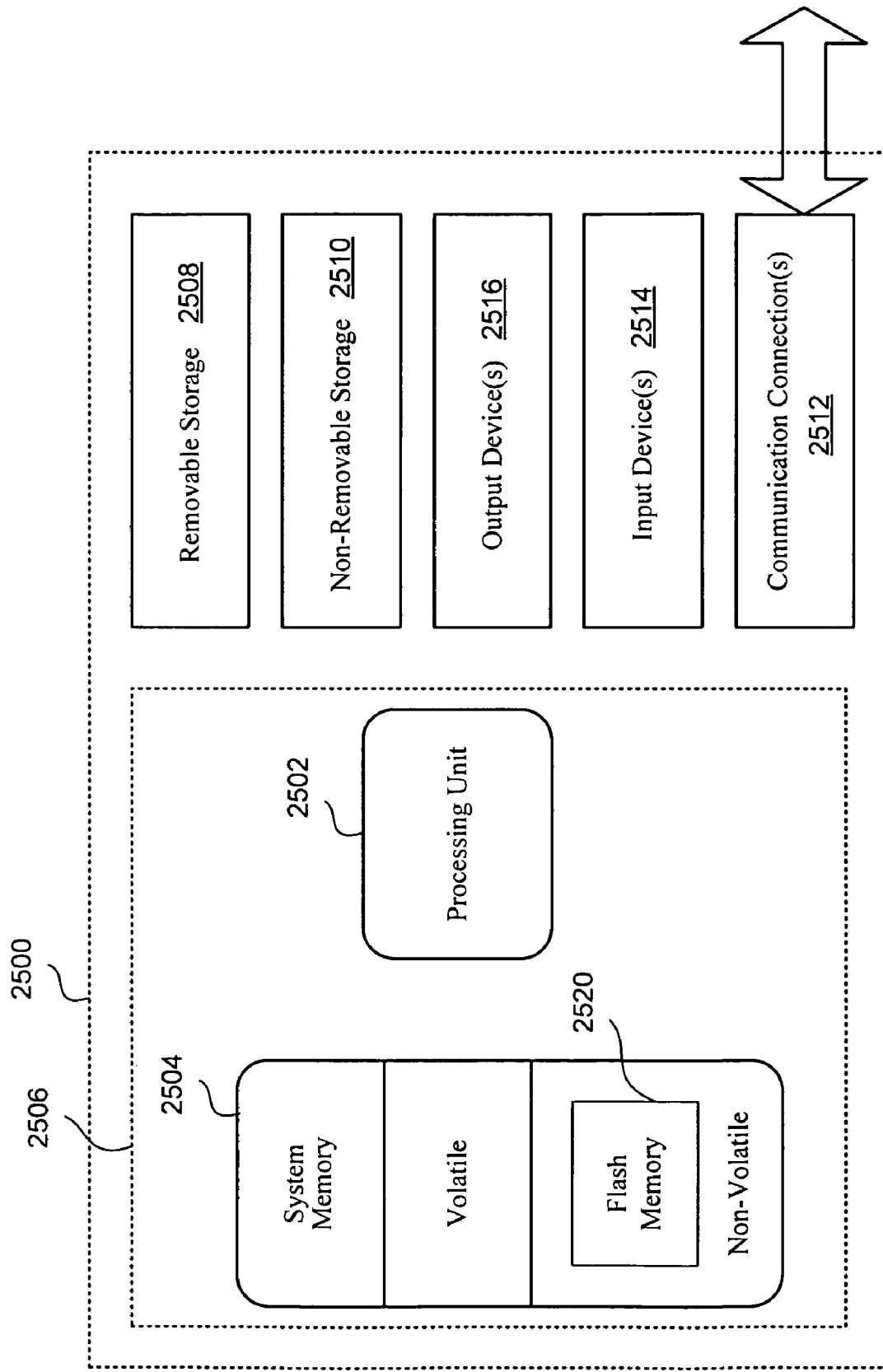
FIG. 25 illustrates a block diagram of an exemplary computing device, upon which embodiments of the invention may be implemented.

FIG. 25 illustrates a block diagram of an exemplary computing device 2500, upon which various embodiments of the invention can be implemented. Although computing device 2500 is shown and described in FIG. 25 as having certain numbers and types of elements, the embodiments are not necessarily limited to the exemplary implementation. That is, computing device 2500 can include elements other than those shown, and can include more than one of the elements that are shown. For example, computing device 2500 can include a greater number of processing units than the one (processing unit 2502) shown. In an embodiment, computing device 2500 can include additional components not shown in FIG. 25.

Also, it is appreciated that the computing device 2500 can be a variety of things. For example, computing device 2500 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2500 can include at least one processing unit 2502 and memory 2504. Depending on the exact configuration and type of computing device, memory 2504 may be volatile (such as RAM), non-volatile (such as ROM, flash memory, etc.) or some combination of the two. This most basic configuration of computing device 2500 is illustrated in FIG. 25 by line 2506. Additionally, device 2500 may also have additional features/functionality. For example, device 2500 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 25 by removable storage 2508 and non-removable storage 2510. Computer storage media includes volatile and nonvolatile, removable and non-removable media implemented in any method or technology for storage of information such as computer readable instructions, data structures, program modules or other data. Memory 2504, removable storage 2508 and non-removable storage 2510 are all examples of computer storage media. Computer storage media includes, but is not limited to, RAM, ROM, EEPROM, flash memory 2520 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2500. Any such computer storage media may be part of device 2500.

In the present embodiment, Flash memory 2520 can include a memory device with a shorter distance between the bit lines and higher storage capacity and density than those conventionally known. In various embodiments, the flash memory 2520 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2520 utilizes newer flash memory technology to allow storing of two physically distinct bits on opposite sides of a memory cell.

Device 2500 may also contain communications connection(s) or coupling(s) 2512 that allow the device to communicate with other devices. Communications connection(s) 2512 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2502, 2504, 2510, 2520, etc.) of computing device 2500 can be coupled to each other in a wide variety of ways. For example in various embodiments, the components of computing device 2500 can be coupled to each other via, but are not limited to, one or more communication buses, one or more data buses, one or more wireless communication technologies, one or more wired communication technologies, or any combination thereof.

Device 2500 may also have input device(s) 2514 such as keyboard, mouse, pen, voice input device, game input device (e.g., a joy stick, a game control pad, and/or other types of game input device), touch input device, etc. Output device(s) 2516 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 26:
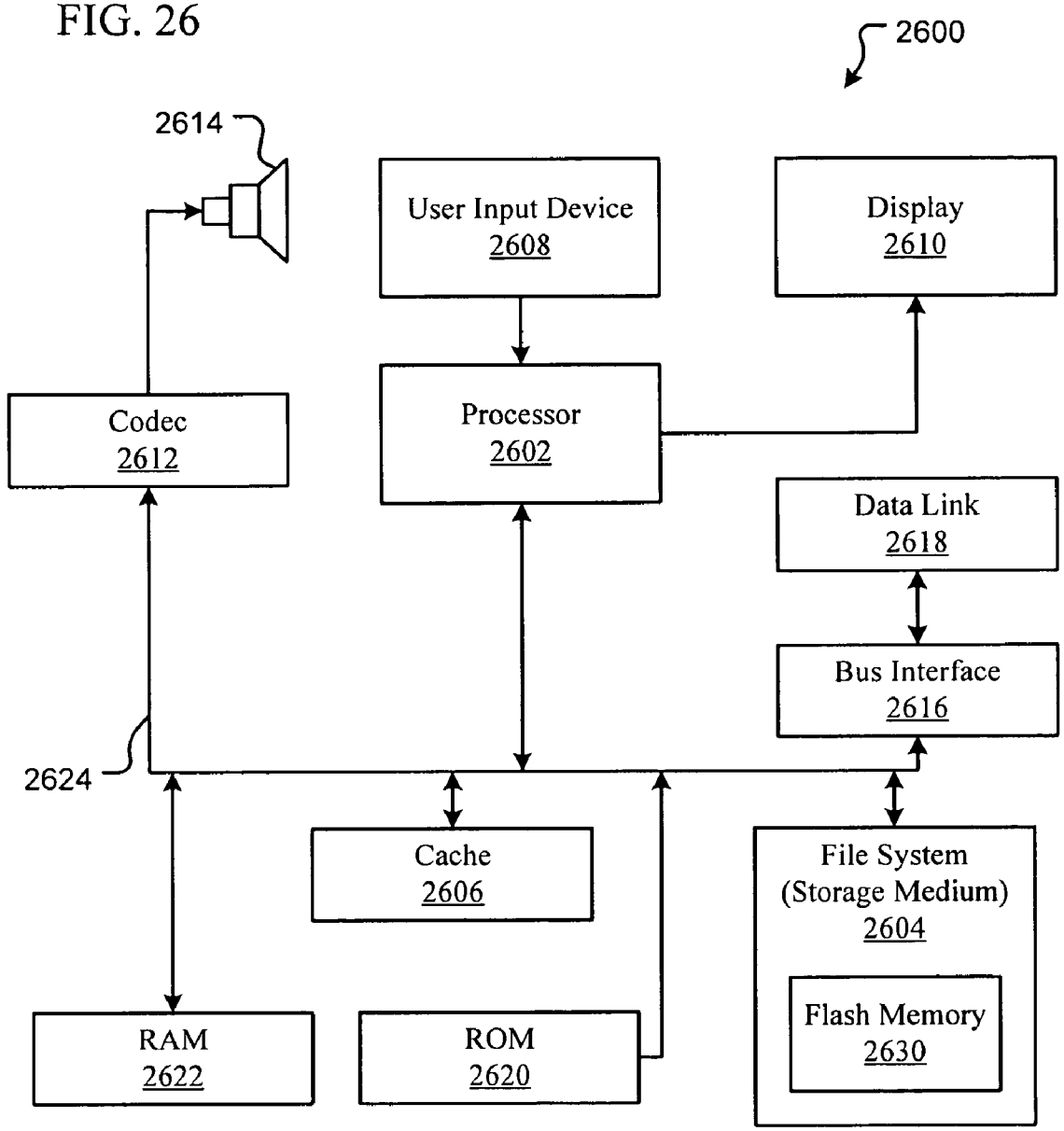
FIG. 26 illustrates a block diagram of an exemplary portable multimedia device, or media player, upon which various embodiments of the invention may be implemented.

FIG. 26 shows an exemplary portable multimedia device, or media player, 2600 in accordance with an embodiment of the invention. The media player 2600 includes a processor 2602 that pertains to a microprocessor or controller for controlling the overall operation of the media player 2600. The media player 2600 stores media data pertaining to media assets in a file system 2604 and a cache 2606. The file system 2604 is, typically, a storage medium or a plurality of storage media, such as disks, memory cells, and the like. The file system 2604 typically provides high capacity storage capability for the media player 2600. Also, file system 2604 includes flash memory 2630. In the present embodiment, Flash memory 2630 can include a nonvolatile memory device with a shorter distance between the bit lines and higher storage capacity and density than those conventionally known. In various embodiments, the flash memory 2630 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 2604 is relatively slow, the media player 2600 can also include a cache 2606. The cache 2606 is, for example, Random-Access Memory (RAM) provided by semiconductor memory. The relative access time to the cache 2606 is substantially shorter than for the file system 2604. However, the cache 2606 does not have the large storage capacity of the file system 2604. Further, the file system 2604, when active, consumes more power than does the cache 2606. The power consumption is particularly important when the media player 2600 is a portable media player that is powered by a battery (not shown). The media player 2600 also includes a RAM 2622 and a Read-Only Memory (ROM) 2620. The ROM 2620 can store programs, utilities or processes to be executed in a non-volatile manner. The RAM 2622 provides volatile data storage, such as for the cache 2606.

The media player 2600 also includes a user input device 2608 that allows a user of the media player 2600 to interact with the media player 2600. For example, the user input device 2608 can take a variety of forms, such as a button, keypad, dial, etc. Still further, the media player 2600 includes a display 2610 (screen display) that can be controlled by the processor 2602 to display information to the user. A data bus 2624 can facilitate data transfer between at least the file system 2604, the cache 2606, the processor 2602, and the CODEC 2612. The media player 2600 also includes a bus interface 2616 that couples to a data link 2618. The data link 2618 allows the media player 2600 to couple to a host computer.

In one embodiment, the media player 2600 serves to store a plurality of media assets (e.g., songs, photos, video, etc.) in the file system 2604. When a user desires to have the media player play/display a particular media item, a list of available media assets is displayed on the display 2610. Then, using the user input device 2608, a user can select one of the available media assets. The processor 2602, upon receiving a selection of a particular media item, supplies the media data (e.g., audio file, graphic file, video file, etc.) for the particular media item to a coder/decoder (CODEC) 2610. The CODEC 2610 then produces analog output signals for a speaker 2614 or a display 2610. The speaker 2614 can be a speaker internal to the media player 2600 or external to the media player 2600. For example, headphones or earphones that couple to the media player 2600 would be considered an external speaker.

In a particular embodiment, the available media assets are arranged in a hierarchical manner based upon a selected number and type of groupings appropriate to the available media assets. For example, in the case where the media player 2600 is an MP3-type media player, the available media assets take the form of MP3 files (each of which corresponds to a digitally encoded song or other audio rendition) stored at least in part in the file system 2604. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 2602, 2604, 2620, 2630, etc.) of media player 2600 can be coupled to each other in a wide variety of ways. For example, in an embodiment, the codec 2622, RAM 2622, ROM 2620, cache 2606, processor 2602, storage medium 2604, and bus interface 2616 can be coupled to data bus 2624. Furthermore, the data link 2618 can be coupled to the bus interface 2616. The user input device 2608 and the display 2610 can be coupled to the processor 2602 while the speaker 2614 can be coupled to the codec 2612. It is pointed out that in various embodiments, the components of media player 2600 can be coupled to each other via, but are not limited to, one or more communication buses, one or more data buses, one or more wireless communication technologies, one or more wired communication technologies, or any combination thereof.

While preferred embodiments of the present invention are described in detail above, the present invention is not limited to those specific embodiments, and within the spirit and scope of the present invention as defined in the appended claims, various modifications and alterations may be made.

The invention claimed is:

1. A semiconductor device comprising:
   a plurality of bit lines disposed on a semiconductor substrate;
   a first ONO film disposed between the plurality of bit lines on the semiconductor substrate; and
   a second ONO film disposed on each bit line of the plurality of bit lines; wherein
   a film thickness of a first silicon nitride film corresponding to the first ONO film is greater than a film thickness of a second silicon nitride film corresponding to the second ONO film.

2. The semiconductor device according to claim 1, wherein:
   the first silicon nitride film includes an upper silicon nitride film and a lower silicon nitride film;
   the upper silicon nitride film and the second silicon nitride film have a same film quality; and
   the lower silicon nitride film and the second silicon nitride film have different film qualities.

3. The semiconductor device according to claim 1, further comprising;
   a third ONO film disposed on the semiconductor substrate;
   a metal silicide layer disposed in an opening in the ONO film on each of the plurality of bit lines; and
   a coupling metal layer directly coupled to the metal silicide layer.

4. The semiconductor device according to claim 3, wherein the opening in the ONO film is offset from an edge of each of the plurality of bit lines.

5. The semiconductor device according to claim 3, further comprising:
   a plurality of word lines formed on the ONO film, the plurality of word lines crossing the bit lines.

6. The semiconductor device according to claim 5, wherein:
the first ONO film is formed between the plurality of bit lines on the semiconductor substrate between the plurality of word lines where the coupling metal layer is not disposed; and
a tunnel oxide film and a trap layer in the first ONO film are formed between the plurality of bit lines on the semiconductor substrate between the plurality of word lines where the coupling metal layer is disposed.

7. The semiconductor device according to claim 5, wherein:
the ONO film is formed between the plurality of bit lines on the semiconductor substrate between the plurality of word lines where the coupling metal layer is not disposed;
a top oxide film in the ONO film is formed on each of the bit lines; and
a tunnel oxide film is formed in the ONO film between the bit lines on the semiconductor substrate; and
a trap layer is formed in the ONO film between the bit lines on the semiconductor substrate between the word lines where the coupling metal layer is disposed.

8. The semiconductor device according to claim 1, further comprising:
a top oxide film in the ONO film being directly disposed on each of the plurality of bit lines.

9. A system, comprising:
a processor;
a cache;
a user input component; and
a flash memory comprising:
a plurality of bit lines disposed in a semiconductor substrate;
a first ONO film disposed between the plurality of bit lines on the semiconductor substrate; and
a second ONO film disposed on each bit line of the plurality of bit lines; wherein
a film thickness of a first silicon nitride film in the first ONO film is greater than a film thickness of a second silicon nitride film in the second ONO film.

10. The system according to claim 9 wherein the system is a portable media player.

11. The system according to claim 9 wherein the system is a computing device.

12. The system according to claim 11, wherein the system is a personal computer.

13. The system according to claim 11, wherein the system is a gaming system.

14. The system according to claim 9 wherein the system is a wireless communications device.

15. The system according to claim 14, wherein the system is a cellular telephone.

* * * * *